United States Patent [19]
Onga et al.

[11] Patent Number: 5,514,904
[45] Date of Patent: May 7, 1996

[54] SEMICONDUCTOR DEVICE WITH MONOCRYSTALLINE GATE INSULATING FILM

[75] Inventors: Shinji Onga, Fujisawa; Takako Okada, Tokyo; Kouichirou Inoue, Yokohama; Yoshiaki Matsushita, Yokohama; Kikuo Yamabe, Yokohama; Hiroaki Hazama, Yokohama; Haruo Okano, Tokyo, all of Japan

[73] Assignee: Kabushiki Kaisha Toshiba, Kawasaki, Japan

[21] Appl. No.: 297,114

[22] Filed: Aug. 26, 1994

[30] Foreign Application Priority Data

Aug. 26, 1993 [JP] Japan .................................. 5-211882
Aug. 25, 1994 [JP] Japan .................................. 6-201128

[51] Int. Cl.$^6$ ......................... H01L 29/04; H01L 31/036
[52] U.S. Cl. ........................... 257/627; 257/628; 257/324
[58] Field of Search .................................. 257/324, 627, 257/628

[56] References Cited

U.S. PATENT DOCUMENTS 4,642,673  2/1987  Miyamoto et al. ...................... 257/319

FOREIGN PATENT DOCUMENTS 0005480  1/1990  Japan .

OTHER PUBLICATIONS

Hane, M., et al. "Atomic and Electronic Structures of an Interface Between Silicon and β–Cristobalite", Physical Review B, vol. 41, No. 18. (1990). pp. 12637–12640.
Tiller, W. A., et al. "On the Kinetics of the Thermal Oxidation of Silicon" J. of Electro Society, vol. 128, No. 3, (1981). pp. 689–696.
Chelikowsky, J. R., et al. "Electron states in α–Quartz: A Self–Consistent Pseudopotential Calculation", Physical Review B, vol. 15, No. 8, (1977). pp. 4020–4029.

Primary Examiner—Robert P. Limanek
Assistant Examiner—David B. Hardy
Attorney, Agent, or Firm—Oblon, Spivak, McClelland, Maier & Neustadt

[57] ABSTRACT

A semiconductor device includes a monocrystalline silicon substrate, an insulating film consisting of a monocrystalline silicon oxide formed on the surface of the monocrystalline silicon substrate, and a conductive film formed on the insulating film. The monocrystalline silicon substrate has a (100) plane orientation, the insulating film essentially consists of β-cristobalite having a unit structure in a $P4_12_12$ structural expression in such a manner that every other silicon atoms of four silicon atoms aligned about a C-axis are arranged on two adjacent silicon atoms aligned in a [110] direction on an Si (100) plane, and that a plane including the C-axis of the β-cristobalite and the [110] direction is set perpendicular to the (100) plane.

32 Claims, 25 Drawing Sheets

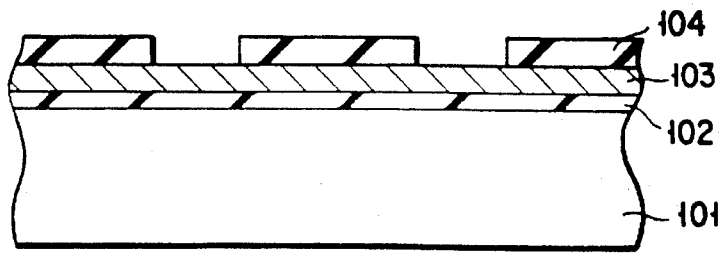
F I G. 10A
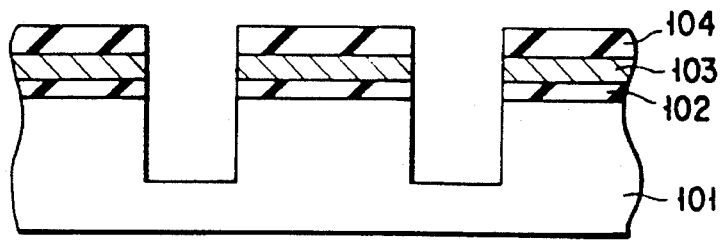
F I G. 10B
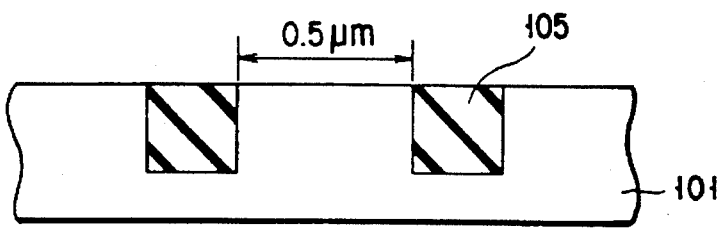
F I G. 10C
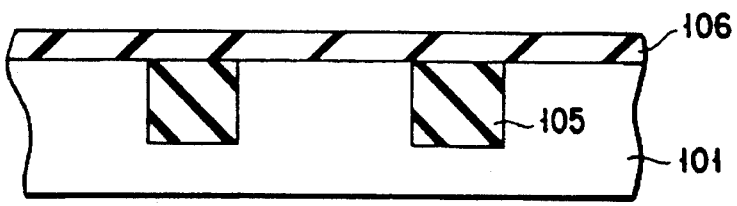
F I G. 10D
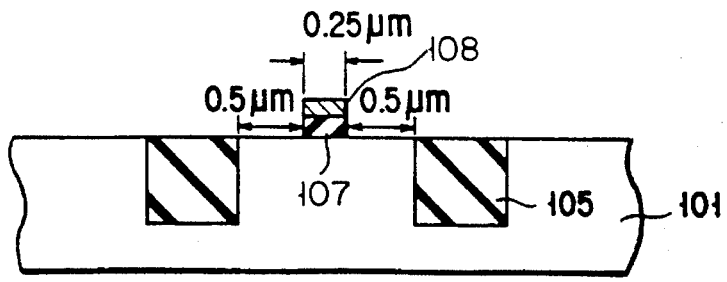
F I G. 10E NEGATIVE TETRAATOMIC
MADELUNG POTENTIAL
OF SiO₄ CLUSTER
--- Si d ORBIT
• O NEGATIVE IONIZATION

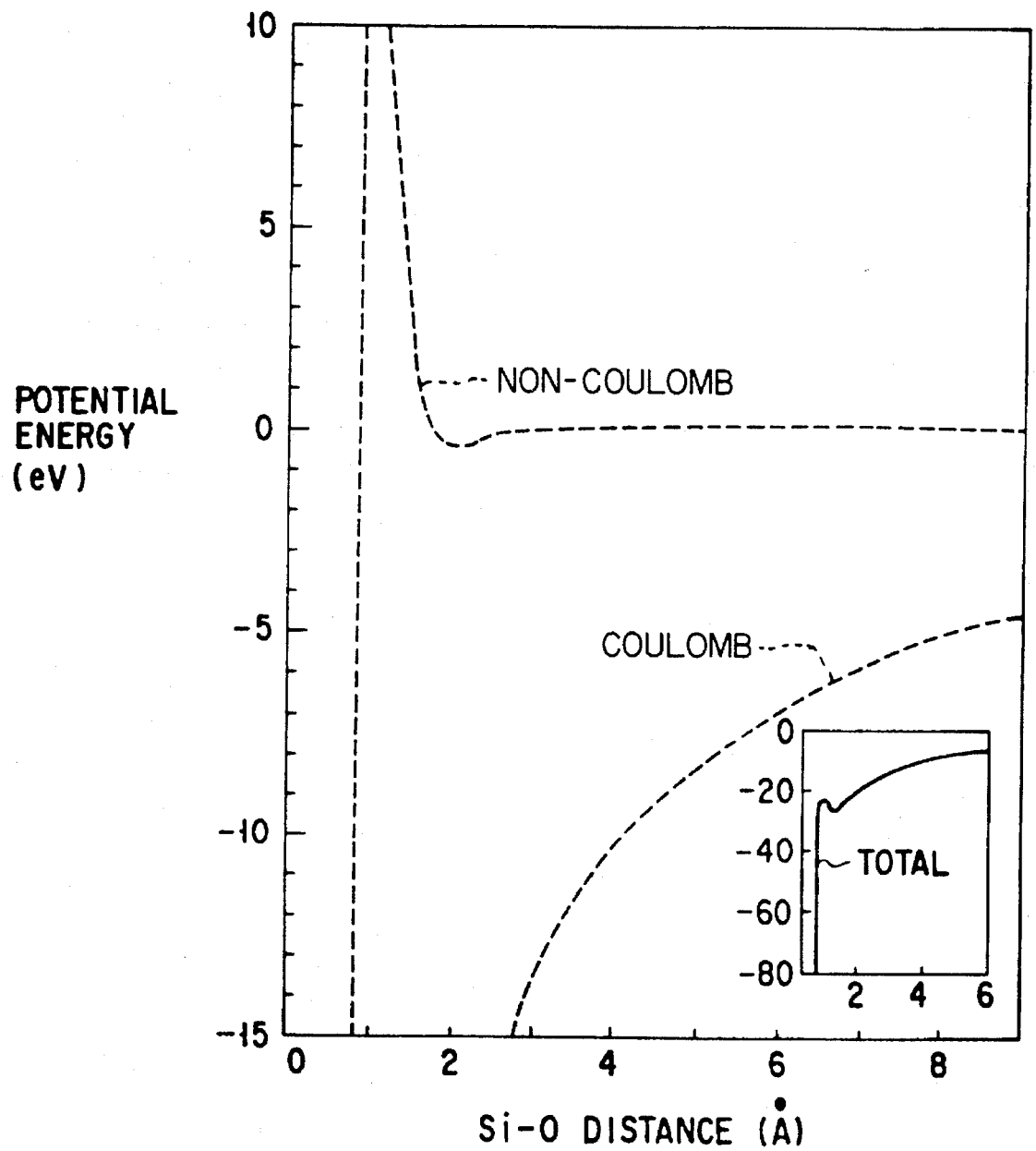
F I G. 15

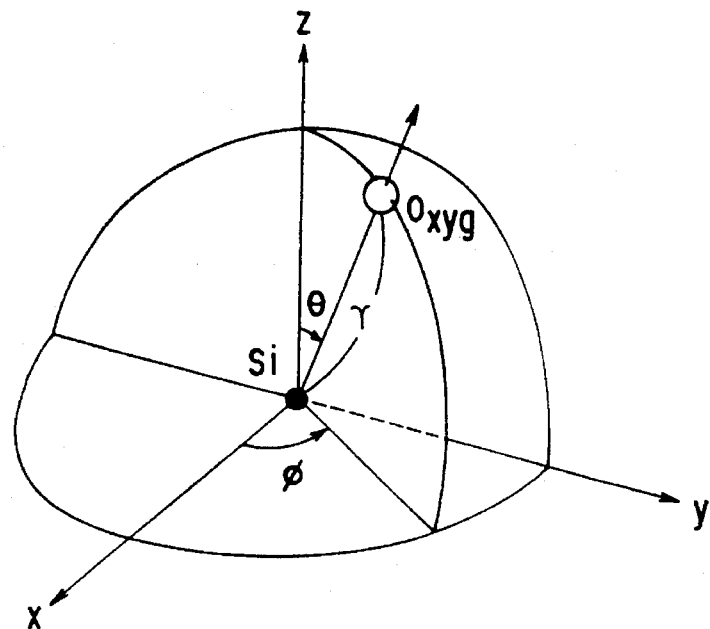
F I G. 17
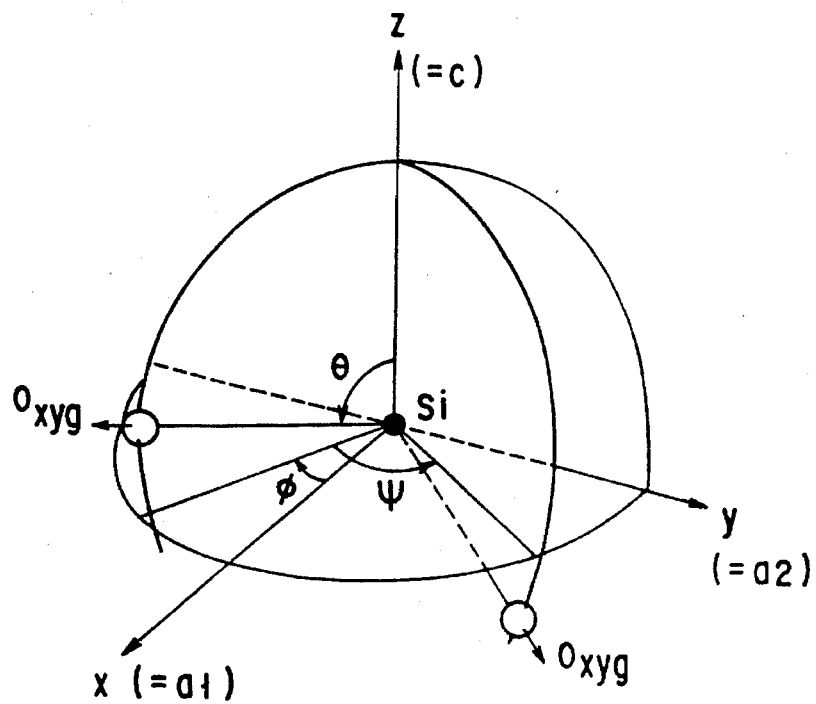
F I G. 18

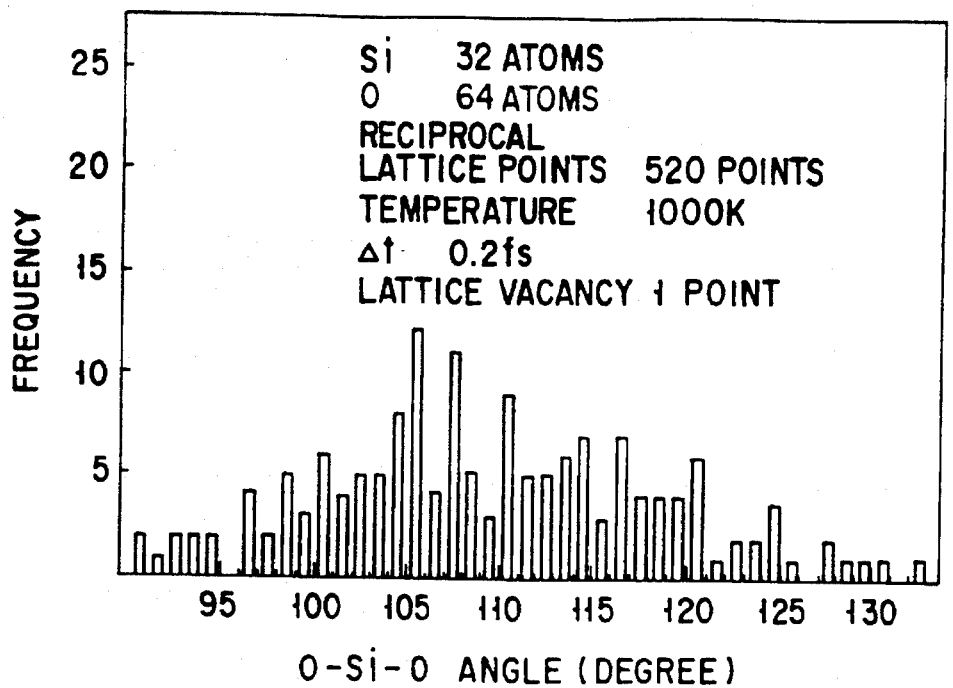
F I G. 19
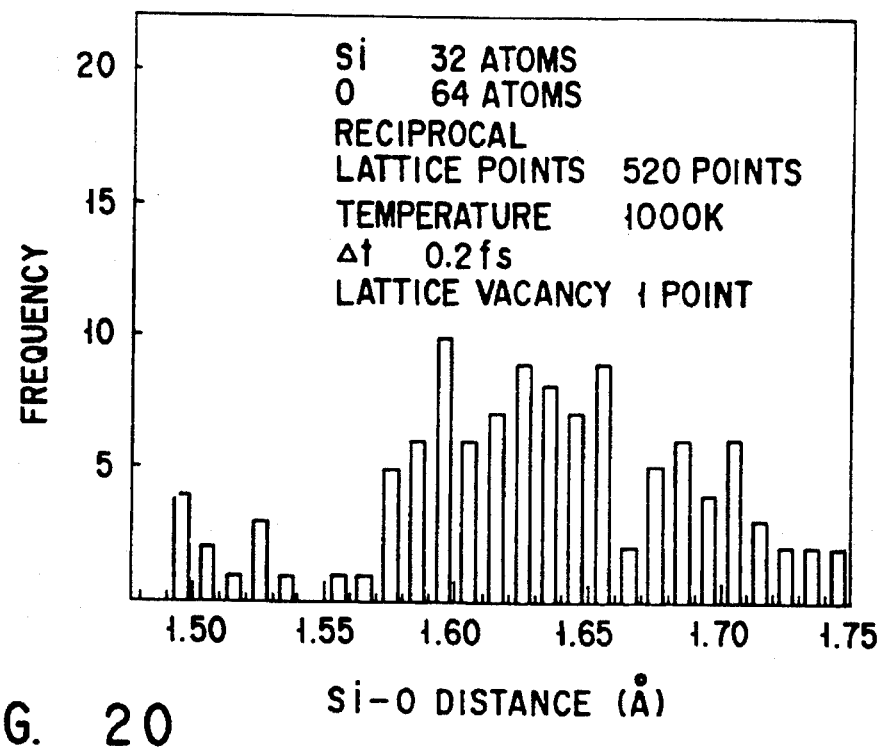
F I G. 20

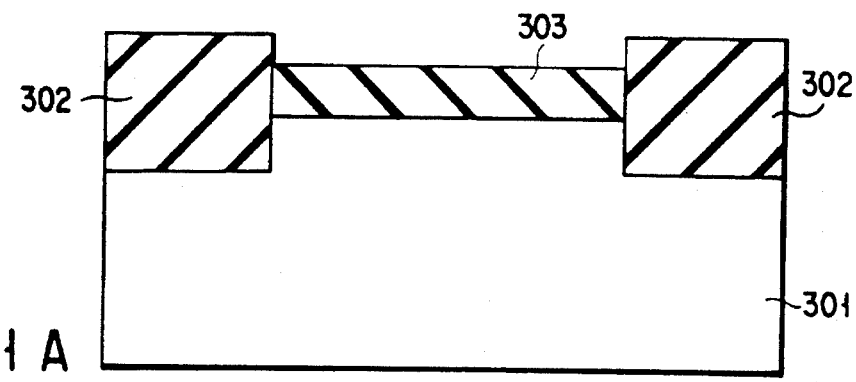
F I G. 31A
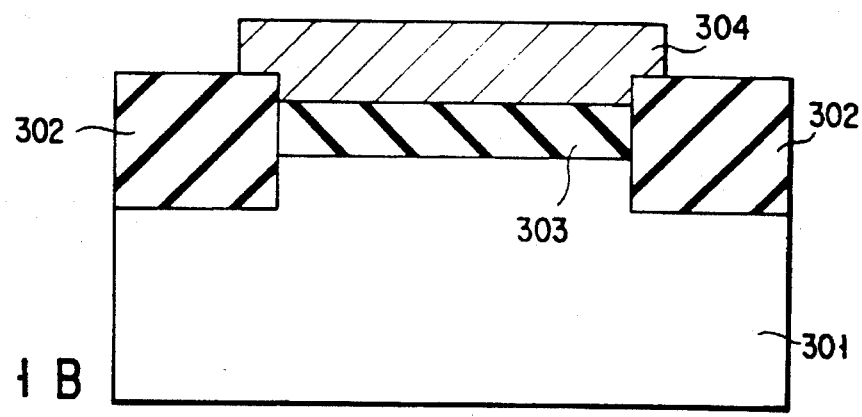
F I G. 31B
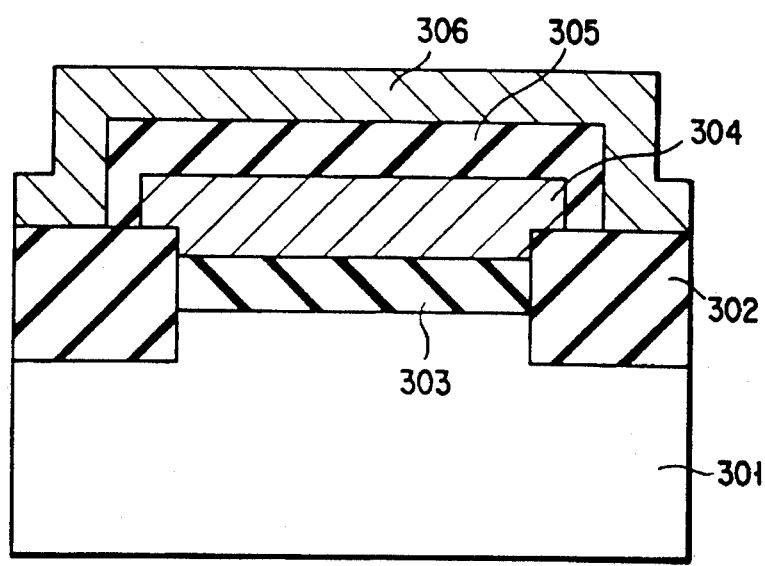
F I G. 31C

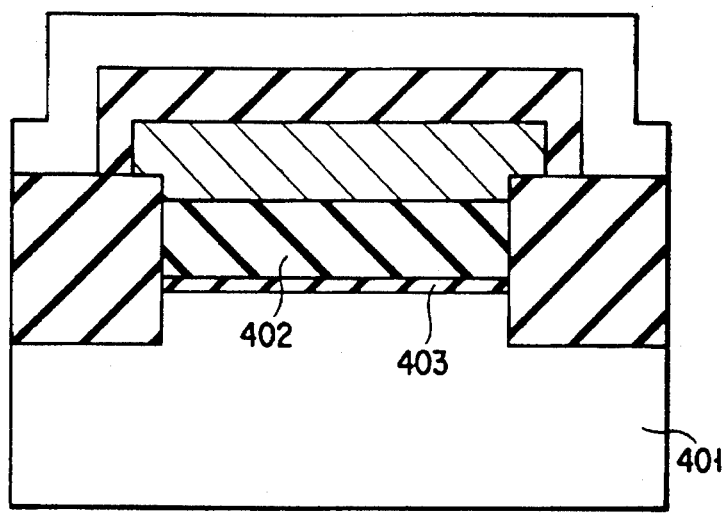
F I G. 32
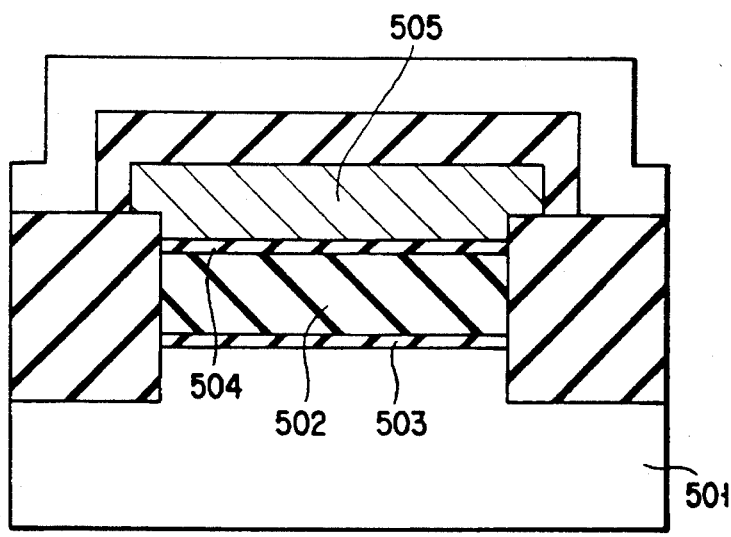
F I G. 33
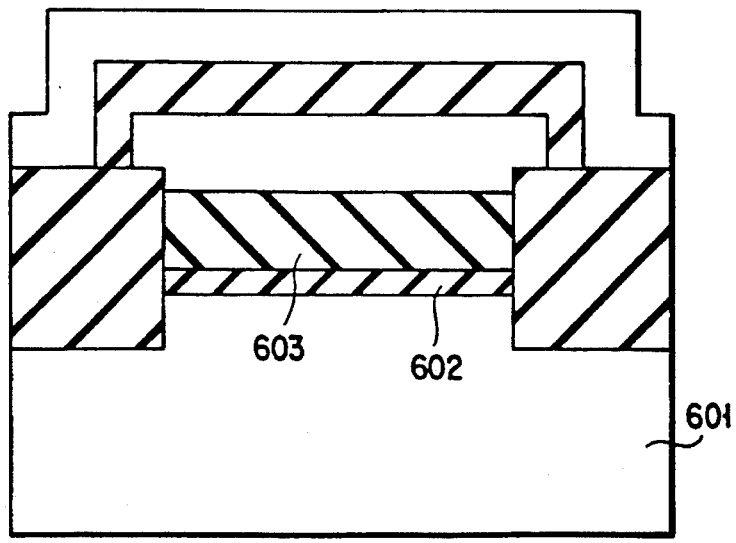
F I G. 34

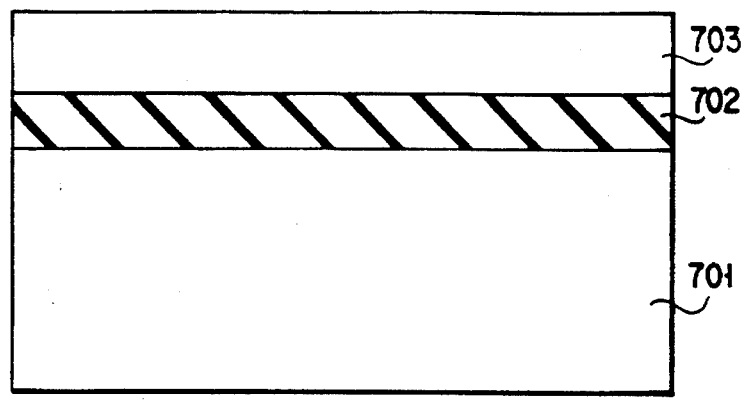
F I G. 35 A
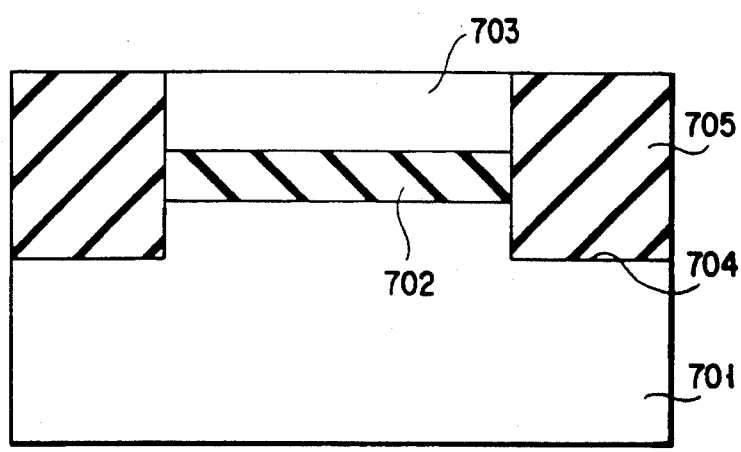
F I G. 35 B
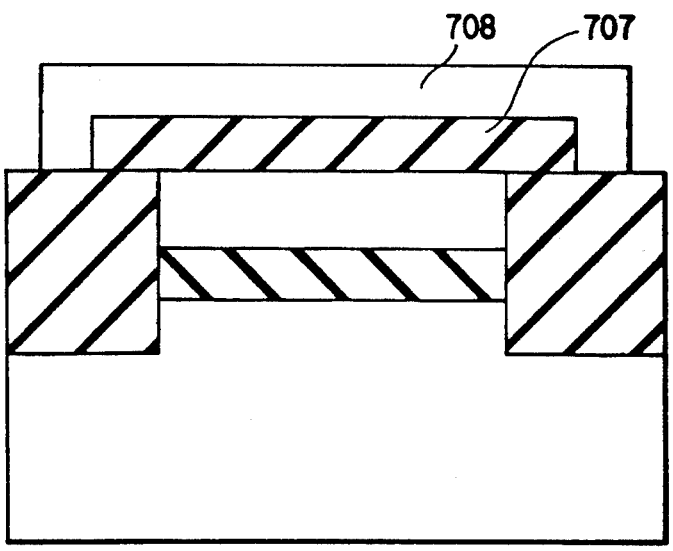
F I G. 35 C

SEMICONDUCTOR DEVICE WITH MONOCRYSTALLINE GATE INSULATING FILM

BACKGROUND OF THE INVENTION

1. Field of the Invention

The present invention relates to a semiconductor device and, more particularly, to a semiconductor device having a monocrystalline insulating film on a semiconductor substrate.

2. Description of the Related Art

The thickness of a gate insulating film in a field effect MOS device formed in a monocrystalline semiconductor substrate is becoming increasingly smaller along with recent trends toward a higher operation speed and a higher integration density of such devices. When the thickness of a gate insulating film is decreased, the threshold voltage is lowered, and the operation speed increases corresponding to the decrease in threshold voltage. The AC characteristics of the device can be particularly improved. Taking an EEPROM or the like as an example, the application conditions of the device become severer while the device is patterned finer. In this case, an oxide film formed by a conventional method no longer provides sufficiently high reliability.

Although a MOS device is micropatterned, not much effort for attaining improvements in the properties of an oxide film itself are made. For this reason, the power supply voltage is not so lowered. Under these circumstances, a high electric field is applied to a gate oxide film particularly during operation of the device. Electrons/holes generated from a channel region by impact ionization or the like are injected into an oxide film depending on boundary conditions such as the polarity of a gate electrode and the drain voltage. Such carriers are trapped in the oxide film to not only degrade long-term reliability but also lower the breakdown voltage or the like.

On the atomic level, when a high electric field is applied to a silicon oxide film formed by, e.g., thermal oxidation, Si-O bonds constituting a silicon oxide film network interact with an external high voltage. As a result, the bonds are dissociated, and the trap centers in which electrons or holes are trapped are formed. Subsequently passing electrons and holes are trapped by the trap centers, and the field strength distribution in the direction of film thickness is locally set higher than the average field strength, finally resulting in dielectric breakdown.

To solve this problem, a technique using a monocrystalline gate insulating film is recently proposed. For example, a monocrystalline cerium oxide ($CEO_2$) is formed on a silicon (111) plane, as reported in J. Appl. Phys., vol. 69 (12), p. 8313 (1991). Monocrystalline calcium fluoride ($CaF_2$) is grown on monocrystalline silicon, as reported in J. Appl. Phys. Suppl., Vol 21-1, p. 187 (1982).

Many of these techniques, however, are still under development or in the theoretical stage. In addition, some problems on calculation techniques as a principle of these techniques are left unsolved. Taking an oxide film as an example, a monocrystalline structure of a gate insulating film using an oxide film has not been accurately explained. Reports concerning the structure of this monocrystalline oxide film include the following:

One is M. Hane. et. al., "Atomic and Electronic Structures of an interface between silicon and β-cristobalite", Physical Review, B. Vol. 41, No. 18, pp. 12637–12640 (1990). In this report, the β-cristobalite is used as a monocrystalline gate oxide film, and a stable structure required for forming this on an underlying Si substrate is calculated. In this reference, however, initial layouts for the angles and distances of Si-O-Si or O-Si-O are incorrect.

W. A. Tiller, "On the Kinetics of the Thermal Oxidation of Silicon, III", J.E.C.S., Vol. 128, No. 3, p. 689 (1981) describes similar monocrystalline oxide film made of quartz. This reference describes the positional relationship between the underlayer and the monocrystalline oxide film made of quartz. However, the structure of the monocrystalline oxide film is simplified, and the principle of this reference is not necessarily correct.

More specifically, as for β low-temperature cristobalite, J. R. Chelikovsky, et. al., "Electron states in a quartz", Physical Review, B. Vol. 15, No. 8, pp. 4020–4029 (1977) points out that "many papers describe models in which the angle of Si-O-Si is simply set to 180° and oxygen atoms are regularly located between the atoms of a diamond lattice, but these models are not accurate and often result in wrong conclusions". Judging from this description, the above papers in 1990 and 1981 are based on the errors pointed out by J. R. Chelikovsky, et. al. For this reason, it is not too much to say that the problem analysis is retrogressive.

The same drawback as in the gate insulating film described above equally applies to a tunnel insulating film in a semiconductor device in which information is stored by accumulating or removing a charge, through the tunnel insulating film, in or from a floating electrode surrounded by an insulating film. More particularly, when a high electric field is applied to the tunnel insulating film, the Si-O bonds constituting a silicon oxide film network interact with an external high voltage. The bonds are dissociated, and trap centers for trapping electrons and holes are formed. Subsequently passing electrons and holes are trapped by the trap centers. The field strength distribution in the direction of film thickness becomes locally higher than the average field strength, thereby further degrading the insulating film.

The interaction between the electric field and the atomic bonds constituting the insulating film depends on the direction of the atomic bonds constituting the insulating film and the direction of the electric field. For this reason, to weaken this interaction, fewer atomic bonds are set in directions along which the interaction is strong. When the directions of atomic bonds are random like in an amorphous substance, some atomic bonds always have a direction along which the interaction is strong.

As described above, almost no relevant discussions have been made to determine design concepts of monocrystalline insulating films. Improvements of the properties of an insulating film itself depend on the formation process means. For example, a cleanest possible surface is prepared in advance, or a substrate is simply oxidized to form an oxide film thereon. Under these circumstances, it is still the case that the problem including the structure of a monocrystalline insulating film awaits a fuller explanation.

SUMMARY OF THE INVENTION

It is an object of the present invention to provide a highly reliable semiconductor device capable of suppressing dielectric breakdown and degradation of an insulating film, which are caused by an electric field.

The present invention has been made as a result of an examination of the positional relationship between a monocrystalline substrate and a monocrystalline insulating film on the basis of a characteristic evaluation function while strictly reproducing a monocrystalline insulating film structure formed on the monocrystalline substrate in accordance with a unique calculation technique.

More specifically, as conditions for forming a monocrystalline insulating film, the present inventors paid attention to particularly Si atoms among all atomic structures consisting of two substances having an interface therebetween, and the crystal orientations of the two substances were selected such that difference between the Si—Si distance of two substance fell within the range of ±7%, thereby preventing formation of a level at the interface. As a result, a high-performance MOS device could be formed.

In particular, to obtain the energy of a system as a whole, the structure of the monocrystalline insulating film had to be properly reproduced, and a specific motion of each constituent atom had to be precisely and accurately determined. For this purpose, the present inventors established a strict, unique potential accumulation method which had not been proposed in molecular dynamics, thereby realizing the above calculation for the first time. In addition, using this potential accumulation method, the quality of the monocrystalline insulating film was also elucidated to sufficiently assure improvements of electrical characteristics and the like.

According to the present invention, there is provided a semiconductor device comprising a monocrystalline silicon substrate, an insulating film consisting essentially of a monocrystalline silicon oxide formed on the monocrystalline silicon substrate, and a conductive film formed on the insulating film. The device may be a capacitor.

In this semiconductor device, the crystal orientations of the monocrystalline silicon substrate and the insulating film are preferably set such that difference between the Si—Si distance of Si atoms in the monocrystalline substrate and that of Si atoms in the insulating film, present at positions corresponding to the Si atoms in the substrate, falls within the range of ±7%, and more preferably ±4%. The oxygen defect concentration of the insulating film preferably falls within the range of 0.01% or less, and more preferably 0.005% or less.

The monocrystalline silicon substrate preferably has a (110) plane orientation. The insulating film preferably consists of monocrystalline quartz having a plane orientation within the range of preferably ±6°, and more preferably ±4% from the (1,–1,0,1) plane. More specifically, the monocrystalline silicon substrate has a (100) plane orientation. The insulating film consists of monocrystalline quartz having a plane orientation within the range of preferably ±6°, and more preferably ±4° from the (1,–1,0,1) or (1,0,–1,0) plane.

According to the present invention, there is provided a semiconductor device comprising a monocrystalline silicon substrate, an insulating film consisting essentially of a monocrystalline silicon oxide formed on the monocrystalline silicon substrate, and a conductive film formed on the insulating film, wherein the monocrystalline silicon substrate has a (100) plane orientation, the insulating film consists essentially of β-cristobalite having a unit structure in a $P4_12_12$ structural expression in which every other silicon atom of four silicon atoms aligned about a C-axis are arranged on two adjacent silicon atoms aligned in a [110] direction on an Si (100) plane, and that a plane including the C-axis of the β-cristobalite and the [110] direction is perpendicular to the (100) plane.

In addition, according to the present invention, there is provided a method of simulating a semiconductor device comprising a monocrystalline silicon substrate, an insulating film consisting essentially of a monocrystalline silicon oxide formed on the monocrystalline silicon substrate, and an electrode formed on the insulating film, which comprises the step of setting crystal orientations of the monocrystalline silicon substrate and the insulating film using a molecular dynamic simulator having an initial value setup program and an energy exchange system calculation program, the initial value setup program controlling an energy balance between the system and an external environment under constant conditions of the number of constituent atoms, an external pressure, and a temperature, and calculating an initial value on the basis of a Maxwell distribution as an initial atomic motion quantity distribution in the insulating film, and the energy exchange system calculation program developing, with no surplus nor deficiency, an energy conservation formula perfectly including a Fourier transform portion and a potential energy portion in accumulating interatomic forces in a reciprocal space as means for calculating a sum total of interatomic forces from an infinite number of atoms using a predetermined number of atoms, and being capable of also calculating a system in which the insulating film exchanges energy with an external environment.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 10A to 10E are sectional views showing the steps in forming an element having a monocrystalline $SiO_2$/Si interface according to the first embodiment of the first aspect of the present invention;

FIG. 15 is a graph showing the relationship between the Si-O distance and the potential energy;

FIG. 17 is a view showing coordinate conversion performed when an Si atom is located at the center (0,0,0) of a sphere having a radius $r$ and four oxygen atoms are located at the four vertex positions of a regular tetrahedron on the sphere;

FIG. 18 is a view showing coordinate conversion performed when an Si atom is at the center (0,0,0) of the sphere having a radius r and four oxygen atoms are located at the four vertex positions of another regular tetrahedron on the sphere;

FIG. 19 is a graph showing an O-Si-O angular distribution;

FIG. 20 is a graph showing an Si-O distance distribution;

FIGS. 31A to 31C are sectional views showing the steps in manufaturing a floating gate type electrically programmable ROM (EPROM) according to the first embodiment of the second aspect of the present invention;

FIG. 32 is a sectional view showing an EPROM according to the second embodiment of the second aspect of the present invention;

FIG. 33 is a sectional view showing an EPROM according to the third embodiment of the second aspect of the present invention;

FIG. 34 is a sectional view showing an EEPRPM according to the fourth embodiment of the second aspect of the present invention;

FIGS. 35A to 35C are sectional views showing an EEPRPM according to the fifth embodiment of the second aspect of the present invention;

DETAILED DESCRIPTION OF THE PREFERRED EMBODIMENTS

The characteristic feature of the present invention lies in that mismatching at an interface between a gate insulating film and a substrate is minimized. When mismatching at this interface is minimized, formation of a level which interferes with a conduction phenomenon can be suppressed, and device reliability can be improved. According to the present invention, a structure which can minimize such mismatching can be predicted by a molecular dynamic simulator.

More specifically, the intent of the present inventors is to examine the computer-aided design process of devices on the atomic or electron level so as to specify dominant rules lying behind observed phenomena, and to use these rules so as to select new materials and perform process designs.

The present invention will be described in detail, by exemplifying various embodiments thereof.

The present inventors optimally designed the gate insulating film of a field effect MOS element using monocrystalline Si as a semiconductor substrate, manufactured an element sample, and evaluated its characteristics. The optimization procedures and sample results will be described below.

Each embodiment will exemplify a β-cristobalite insulating film as a monocrystalline insulating film, and an Si surface has, e.g., a (100) plane. It is important to determine an optimal positional relationship between the Si (100) plane and the β-cristobalite constituting the monocrystalline insulating film. The total free energy of a system is defined as an evaluation function, and the system is an $Si/SiO_2$ interface.

The present inventors prepared a free energy formula as a strict evaluation function in advance and found the following optimal relationship between the β-cristobalite and Si (100) during voltage application. That is, a line $\underline{m}$ falling within the angular range between $a_1$- and $a_2$-axes in the $P4_12_12$ structural expression of the β-cristobalite is aligned with the [110] direction on the Si (100) plane, and at the same time, the C-axis is inclined to face the first and third Si positions toward Si on the Si (100) plane.

In a unit structure in a $P4_12_12$ structural expression of the β-cristobalite, most preferably, every other silicon atoms of four silicon atoms aligned about a C-axis are arranged on two adjacent silicon atoms aligned in the [110] direction on the Si (100) plane, and a plane including the C-axis of the β-cristobalite and the [110] direction is set perpendicular to the (100) plane. The view of the $Si/SiO_2$ interface formed based on this finding is shown in FIGS. 1A and 1B.

Figure 1A:
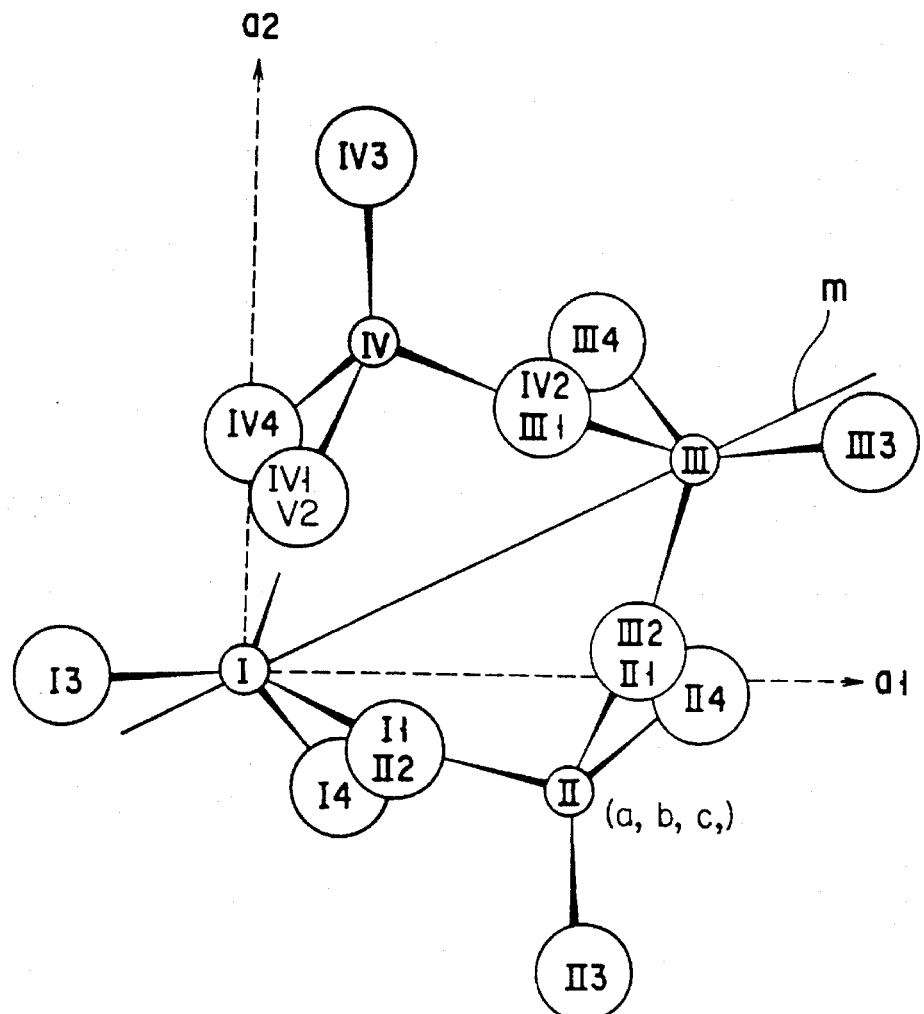
FIGS. 1A and 1B are views illustrating an Si/cristobalite $SiO_2$ interface.
Figure 1B:
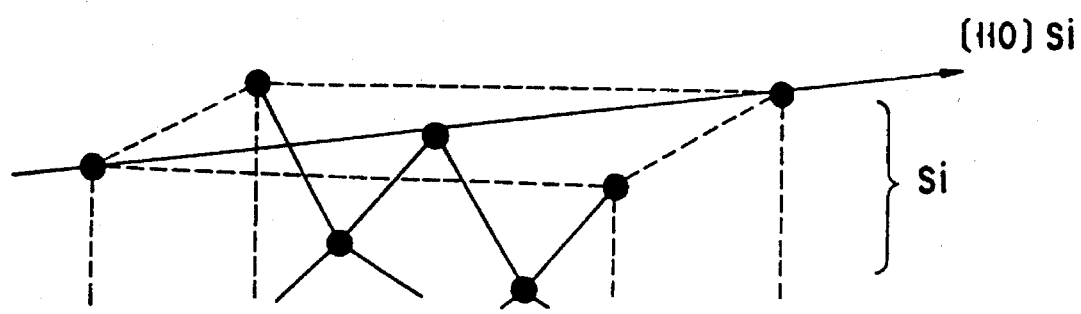

FIG. 1A is a plan view showing a single lattice of the β-cristobalite, and FIG. 1B shows the sketch of the Si (100) plane. Numbers I, II, III, and IV in FIG. 1A represent Si numbers. The expressions of I3, II2, II4, IV1, and the like respectively represent the third oxygen atom belonging to silicon I, the second oxygen atom belonging to silicon II, the fourth oxygen atom belonging to silicon III, the first oxygen atom belonging to silicon IV, and the like.

According to the present invention, it is found that line m obtained by connecting silicon I and silicon III in the cristobalite are optimally set parallel to the [110] Si direction shown in FIG. 1B. Although a detailed description of this configuration will be described in detail later, the C-axis of the cristobalite must be inclined so that the line m obtained by connecting silicon I and silicon III are set parallel to the [100] Si direction. According to the calculations and findings of the present inventors, when the C-axis of the cristobalite was inclined, the line obtained by connecting silicon I and silicon III were set parallel to the [110] direction, and at the same time, the total energy at the interface between the β-cristobalite and the Si (100) could be decreased by 10%.

Figure 2:
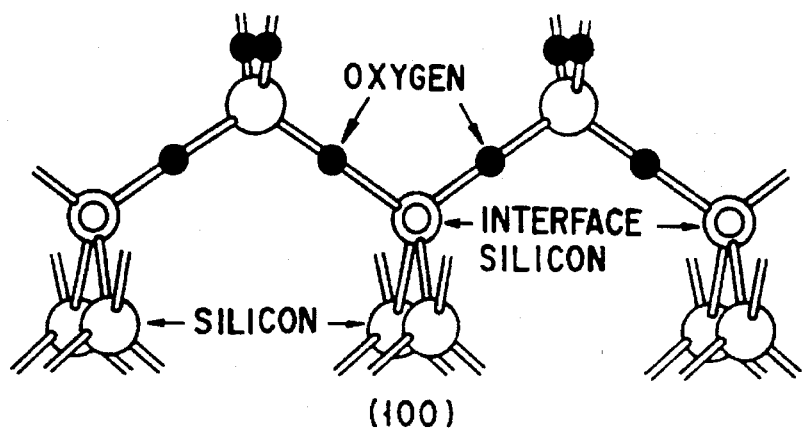
FIG. 2 is a view illustrating an Si/$SiO_2$ interface in a conventional example.

A conventionally proposed structure is illustrated in FIG. 2. As can be apparent from FIG. 2, it is conventionally accepted that an Si-O-Si bond is linear in a cristobalite structure. That is, the interface design is performed based on the principle of FIG. 2 in M. Hane, et. al., "Atomic and Electronic Structures of an interface between silicon and β-cristobalite", Physical Review, B. Vol. 41, No. 18, pp. 12637–12640 (1990).

The free energy at the interface, which plays an important role in the present invention, greatly influences element characters, as will be described in detail below. An increase in free energy, which is caused by mismatching at an interface between a gate insulating film and a substrate tends to form unpaired atoms, thereby enhancing formation of an interface state. This interface state interferes with a conduction phenomenon and results in degradation of reliability. Even in an insulating film, defects such as π-bonds are formed and may serve as the centers. The allowable range of these defects can be determined, as will be described later.

Figure 3:
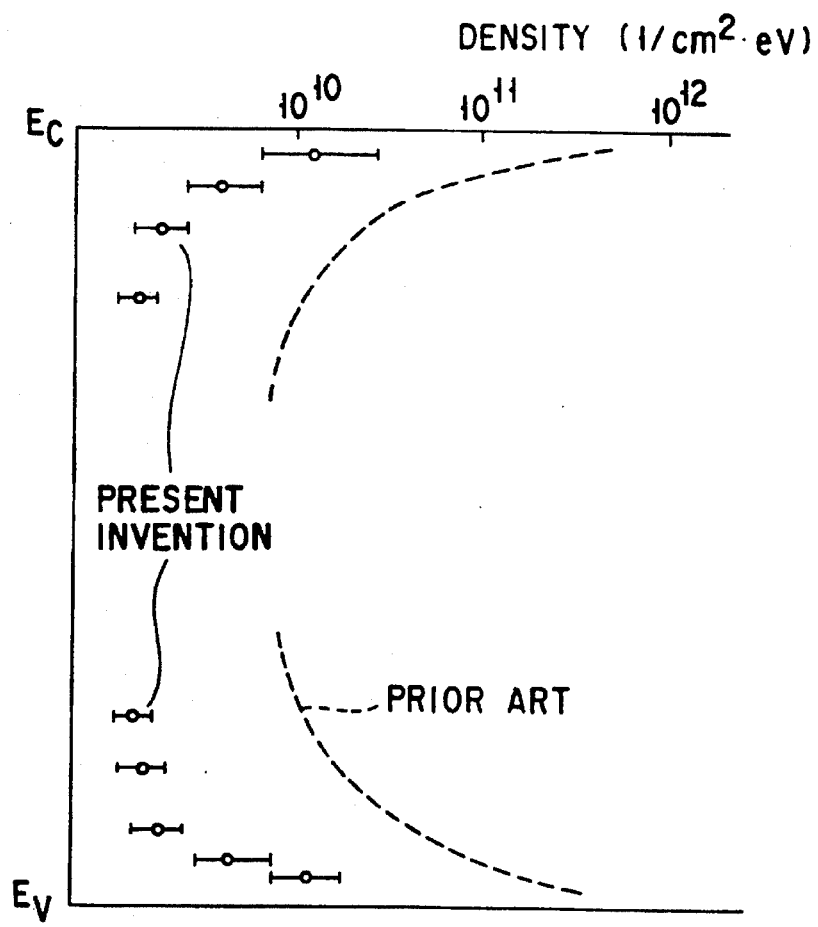
FIG. 3 is a graph showing the interface level distributions of a MOS element of the present invention and a conventional MOS element.

The interface state distributions of a MOS device of the present invention and a conventional MOS device are shown in FIG. 3. Reference symbol Ec denotes the energy level of a conduction band; Ev, the energy level of a valence band. The data in FIG. 3 are obtained by using a Cv method as a method of effectively evaluating an interface state. As can be apparent from FIG. 3, the interface state of the MOS device of the present invention is reduced to about 1/10 that of the conventional example. When the MOS device of the present invention was evaluated under the same electric field condition, carrier mobility could be increased by about 12%, and device reliability was also improved.

Figure 4:
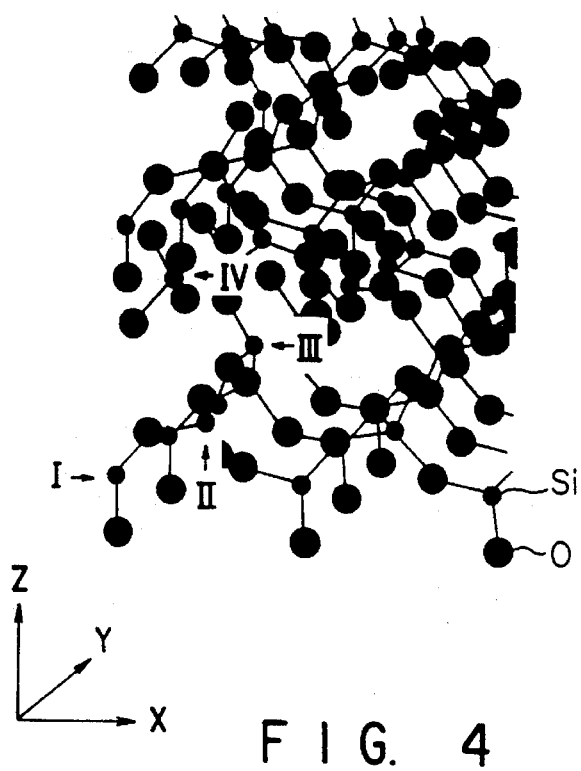
FIG. 4 is a perspective view of the strict structure of cristobalite clarified by the present inventors for the first time.

FIG. 4 is a perspective view showing the atomic configuration of cristobalite whose strict structure could be clarified by the present inventors for the first time. A large full circle in FIG. 4 represents oxygen, and a small full circle dot represents Si as exemplified by numbers I, II, III, and IV. The Z-axis represents the C-axis of the cristobalite. As can be apparent from FIG. 4, it is very difficult to predict a specific cristobalite plane to which a specific Si plane is well adhered to because the cristobalite structure is very complicated.

Figure 6:
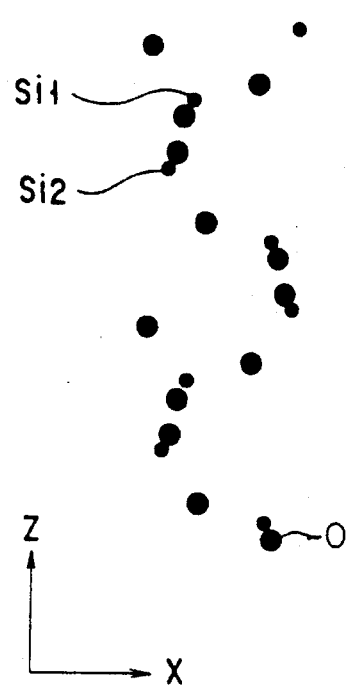
FIG. 6 is a view showing a structure obtained by slightly distorting the cristobalite.
Figure 5:
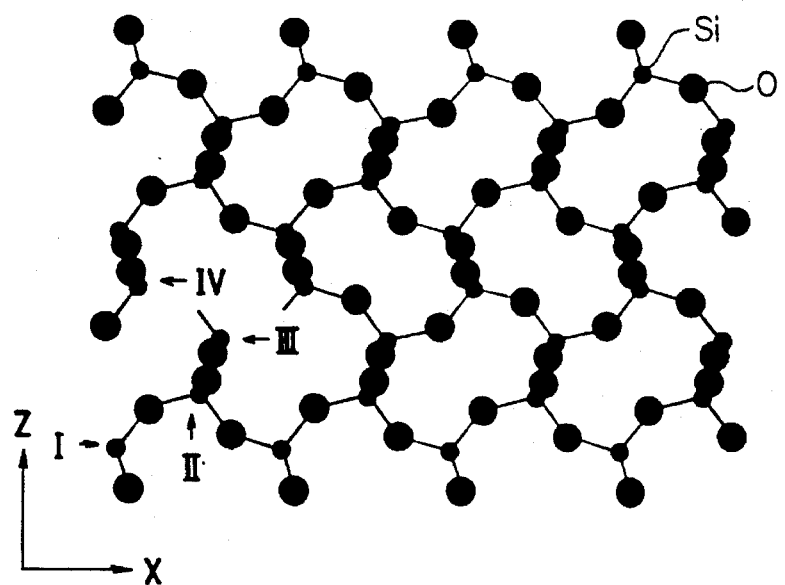
FIG. 5 is a view of the cristobalite in FIG. 4 when viewed from the Y-axis.

FIG. 5 is a view of the atomic configuration in FIG. 4 when viewed from the Y-axis (i.e., a direction perpendicular to the C-axis). As can be apparent from FIG. 5, large spacings are present in the cristobalite structure. A structure obtained by slightly distorting this cristobalite structure upon application of a hydrostatic pressure is shown in FIG. 6. Taking Si1 and Si2 in FIG. 6 as an example, it is apparent that they have a large spacing therebetween. The present inventors cut the cristobalite along other planes, and the conditions are considerably specific. It is found that deformation along the C-axis direction (Z-axis direction) preferentially has occurred.

Figure 7A:
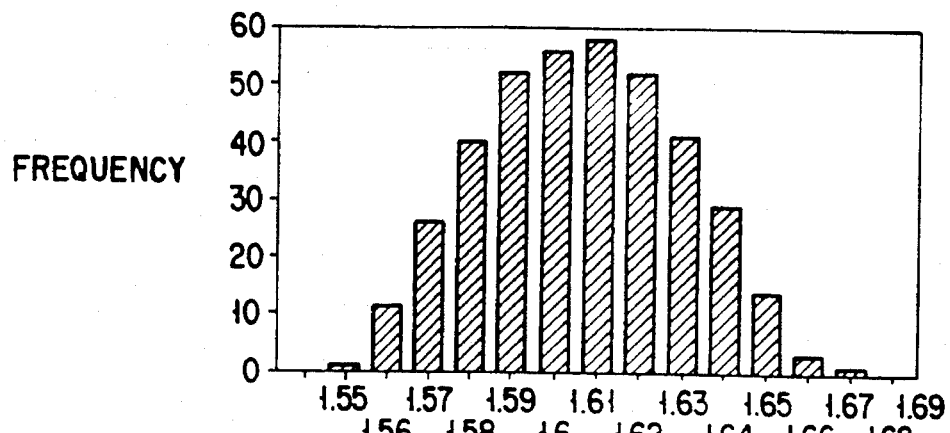
FIGS. 7A to 7C are graphs showing the interatomic distance distribution and angular distributions of the cristobalite which are obtained by a simulator built by the present inventors.
Figure 7B:
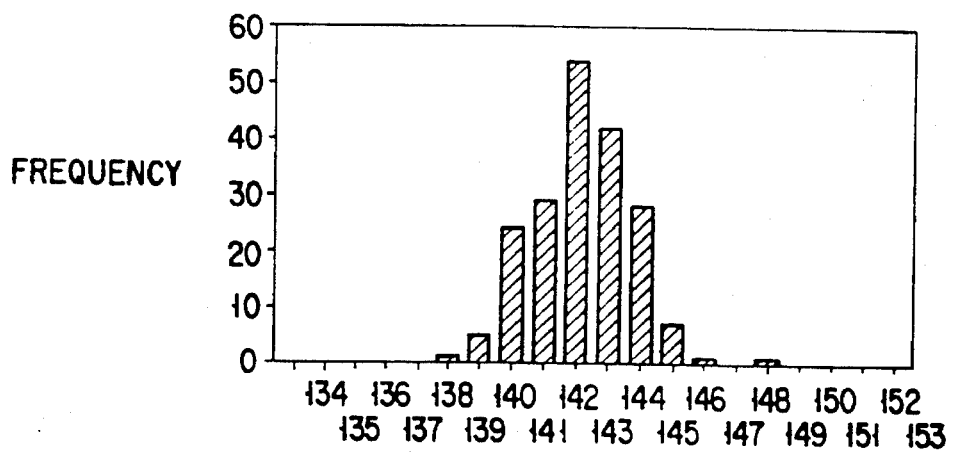
Figure 7C:
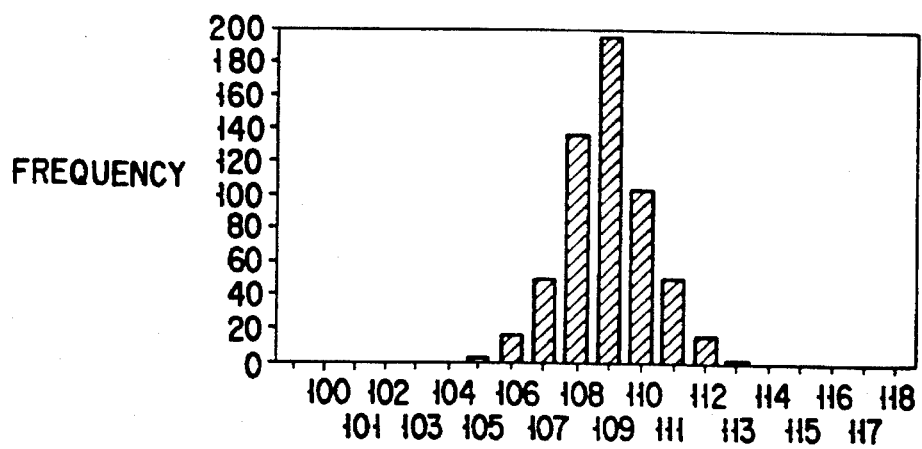

FIGS. 7A to 7C show the interatomic distance distribution and the angular distributions of the cristobalite, using a new simulator built by the present inventors. As is apparent from FIG. 7A, the maximum frequency of the distance corresponds to 1.61 A. The maximum frequency angles are 142° and 109° from FIGS. 7B and 7C. In this manner, the molecular dynamic simulator according to the present invention is confirmed to match well with actual experimental values.

Figure 8:
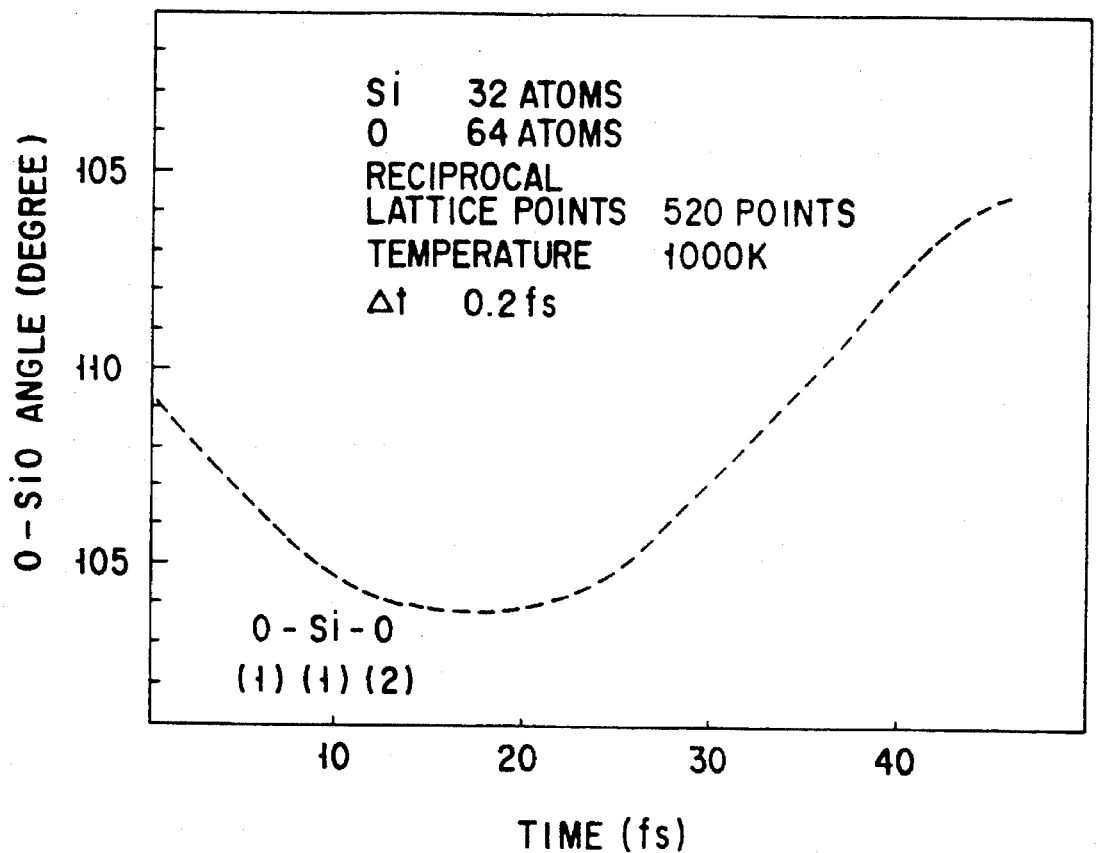
FIG. 8 is a graph showing the calculation results of vibration outputs of an O-Si-O angle, which outputs are obtained by the simulator built by the present inventors.

Contradistinction of spectral data serves as one of the methods of checking precision of a molecular dynamic simulator. That is, the frequencies of the O-Si-O and Si-O-Si in the rocking and stretching modes are read from the spontaneously changing positions of the Si and oxygen atoms, and natural frequencies are obtained from these read values when these values are compared with actual measurement values, the calculation values are 440 cm$^{-1}$ and 1,100 cm$^{-1}$, whereas the actual measurement values are 490 cm$^{-1}$ and 1,111 cm$^{-1}$. The calculation values are found to fall within a proper range. An increase in intensity of the O-Si-O mode upon application of a pressure to an insulating film was found to match well with the actual measurement value. The calculation results of the corresponding vibration outputs of the O-Si-O angle are shown in FIG. 8. Time is plotted along the abscissa of FIG. 8 and graduation starts from 0.0 fs. The present inventors took 1,500 fs until they confirmed that the results sufficiently followed an external pressure in the molecular dynamic calculation. Therefore, the results in FIG. 8 are obtained upon a lapse of 1,500 fs from the start of the experiment.

Figure 9A:
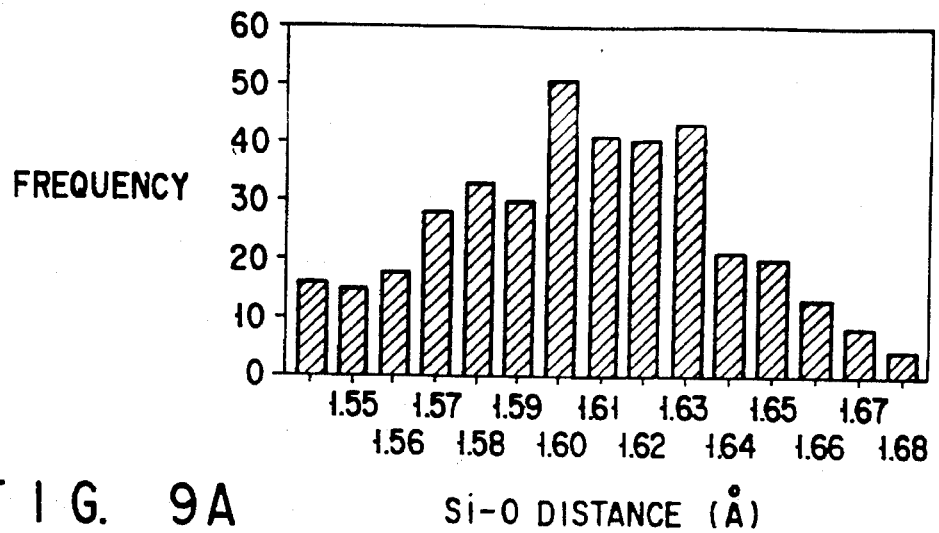
FIGS. 9A to 9C are graphs showing an SiO distance distribution and Si-O-Si and O-Si-O angular distributions when a large compressive stress is applied.
Figure 9B:
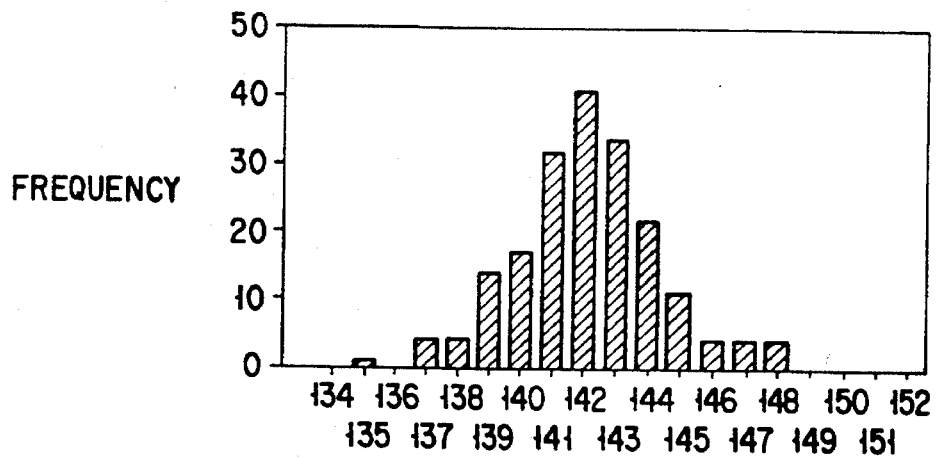
Figure 9C:
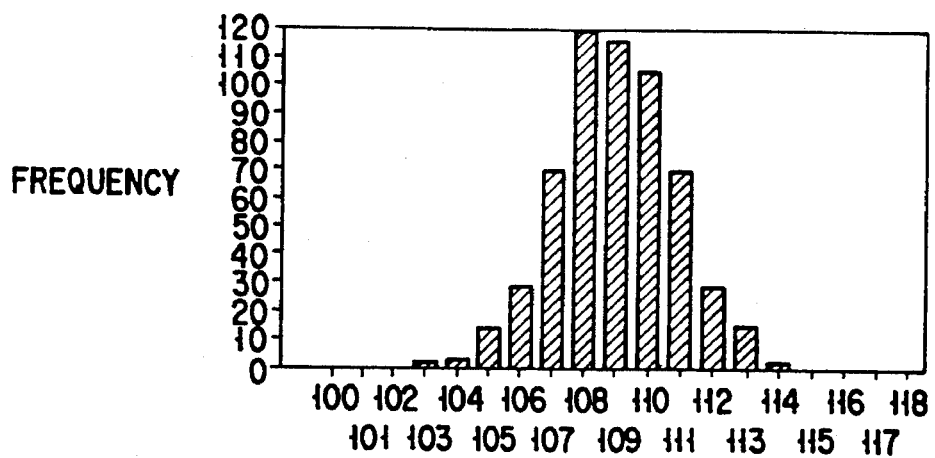

The prevent inventors also performed similar calculations when a very large compressire stress was applied, and the results are shown in FIGS. 9A to 9C. These results were obtained when the volume compression ratio was 0.6%, which could be converted into a stress of 6 to 8×10$^8$ dyne/cm$^2$. As can be apparent from FIG. 9A, when the compressire stress is considerably increased, the distance distribution is wide. As can also be apparent from FIGS. 9B and 9C, the angular distribution is wide. With this structure, a higher gain of the total energy in SiO$_2$ was found to be obtained.

The present inventors developed such a new simulation and examined a cristobalite plane with which a monocrystalline Si plane best matched. In a unit structure in a P4$_1$2$_1$2 structural expression of the β-cristobalite, it was found that, most preferably, every other silicon atom of four silicon atoms aligned about a C-axis were located on two adjacent silicon atoms aligned in the [011 ] direction on the Si (100) plane, and a plane including the C-axis of the β-cristobalite and the [011] direction was set perpendicular to the (100) plane.

At this time, the difference (misfit ratio) between the distance between the first Si and the third Si in the cristobalite structure and the Si—Si distance on the Si (100) plane in monocrystalline Si was 4.7%.

The present inventors manufactured an SiO$_2$/Si interface sample on the basis of the above principle. The procedures for forming a device having such an SiO$_2$/Si interface are shown, and its characteristics are also described.

As shown in FIG. 10A, a thermal oxide film 102 having a thickness of, e.g., 10 nm is grown on a monocrystalline Si substrate 101 having a (100) plane, and a poly-Si film 103 is deposited on the thermal oxide film 102 to a thickness of, e.g., 200 nm. $Si_3N_4$ is then formed on the poly-Si film 103. The resultant $Si_3N_4$ film is patterned using a photoetching method to form an $Si_3N_4$ pattern 104. The resultant structure is etched by RIE using the $Si_3N_4$ pattern 104 as a mask to form a groove having a depth of, e.g., 0.7 μm in the monocrystalline Si substrate 101, as shown in FIG. 10B.

An amorphous $SiO_2$ film 105 is then buried in this groove at a low temperature. The thermal oxide film 102, the poly-Si film 103, and the $Si_3N_4$ pattern 104 on the monocrystalline Si substrate 101 are removed to obtain a structure shown in FIG. 10C. As shown in FIG. 10D, a cristobalite film 106 having a predetermined cut crystal face is formed on the surface of the structure shown in FIG. 10C in accordance with a direct bonding method.

At this time, in the unit structure in the $P4_12_12$ structural expression of the β-cristobalite, every other silicon atoms of four silicon atom aligned about a C-axis are arranged on two adjacent silicon atoms aligned in the [110] direction on the Si (100) plane, and a plane including the C-axis of the β-cristobalite and the [110] direction is set perpendicular to the (100) plane. In this case, the size of the Si element region is, e.g., 1.25 μm.

As shown in FIG. 10E, the cristobalite film 106 is patterned to form a gate insulating film 107 and a gate electrode 108. At this time, the gate width was set to 0.25 μm, and the width of a portion in which a source or drain region was to be formed was 0.5 μm.

The present inventors inclined the cristobalite surface in various directions by, e g , ±1°, ±3°, ±4°, ±6°, ±10°, and ±15° from the above plane, i.e., the (1,–1,0,1) plane and bonded cristobalite samples on the silicon substrate samples. The bonded interfaces were examined with a TEN (Transmission Electron Microscope). Dislocations were found in neither Si nor $SiO_2$ up to ±6°. When the inclination angle, however, exceeded ±6°, dislocations were found in Si or $SiO_2$ particularly in the inclination angle of ±10° or more. It is, therefore, found that the cristobalite plane orientation must fall within the range of ±6°, and preferably ±40° from the (1,–1,0,1) plane to prevent dislocations at the interface between the cristobalite and the monocrystalline Si substrate having the (110) plane orientation.

When the monocrystalline Si substrate 101 has the (100) plane orientation, the cristobalite plane orientation falls within the range of ±6°, and preferably ±4° from the (1,–1,0,1) or (1,0,–1,0) plane.

Although the gate width was set to 0.25 μm in the above embodiment, examinations were performed at different gate widths, i.e., 0.3 μm, 1.0 μm, and 2.0 μm. No dislocations were found at the gate width of 0.3 μm. However, dislocations were found at the gate widths of 1.0 μm and 2.0 μm.

Figure 30:
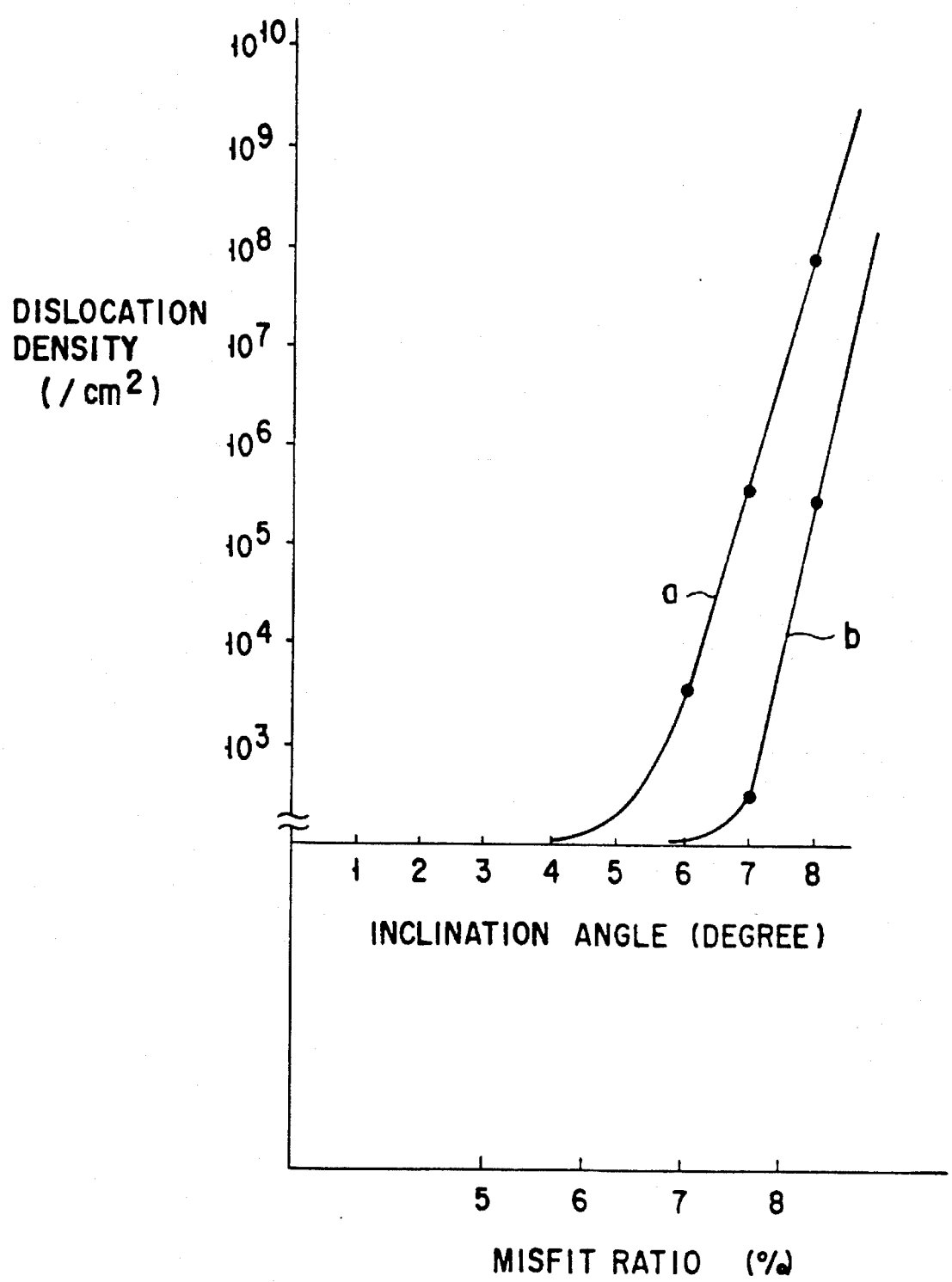
FIG. 30 is a graph showing the dislocation density as a function of the inclination angle and misfit ratio of a cristobalite surface.

In FIG. 30, the inclination angle of the cristobalite surface, and the misfit ratio between the Si—Si distance of the cristobalite structure and the Si—Si distance on the Si (100) plane are plotted along the abscissa, and the dislocation density is plotted along the ordinate. FIG. 30 shows the relationship between them. A curve a represents the result at the gate width of 0.5 μm, and a curve b represents the result at the gate width of 0.25 μm.

From the graph in FIG. 30, when the inclination angle of the cristobalite surface at the gate width of 0.5 μm is 6° or less, and the misfit ratio is 7% or less, and preferably 4% or less, a lower dislocation density is apparently obtained. Almost no dislocation is found at a gate width of 0.25 μm, a cristobalite surface inclination angle of 6° or less, and a misfit ratio of 7% or less.

The reason why dislocations occur depending on the direction of the cristobalite surface and the gate width is not perfectly explained yet. However, this may be caused due to the following reason.

That is, the Si—Si spacing of the cristobalite is not necessarily equal to the [110] Si spacing on the Si (100), and a difference of about 5% is present, as described above. When Si and cristobalite were bonded to each other in the presence of the above difference, the resultant $Si/SiO_2$ interface was examined with a TEM (Transmission Electron Microscope). It was found that layers up to the fourth to seventh atomic layers were slightly distorted. In this manner, since the atomic configuration near the $Si/SiO_2$ interface is naturally distorted, Si matches with $SiO_2$ in a narrow region, even if plane orientations are lightly shifted at the interface.

To the contrary, when the difference exceeds 6°, the difference in the Si—Si spacing becomes 8% or more, thereby causing dislocations, when the element region is as large as 1.0 μm, mismatching occurs in the peripheral portion although perfect matching is established near the center, thereby causing dislocations.

The present inventors paid attention to the Si—Si spacing because they found that the interatomic spacing changed upon bonding an Si substrate and cristobalite, as described above. In this case, when a new surface is formed, the interatomic spacing also changes immediately. A value which is not of a surface but of a portion inside a structure is employed as a representative value.

The present inventors developed a strict accumulation formula for a strict ionic bonding potential for a region including an oxide film and monocrystalline Si and found a new, optimal positional relationship between the oxide film and the monocrystalline Si in accordance with this new technique. Any conventional technique lacks strictness, and is incapable of accurately calculating, particularly, the energy of a system. That is, the present inventors built a totally new simulator to simulate a single crystal, e.g., cristobalite constituting an oxide film.

The simulator prepared by the prevent inventors will be described below in comparison with a conyentional one. Three potentials in the Si-O, O—O, and Si—Si portions must be strictly expressed. It is actually very difficult to express a total potential in the Si-O, O—O, and Si—Si portions. The accumulation amounts of the three different potentials infinitely diverge due to the term of the distance r. The calculation itself employs a conventional Ewald method in a slightly stricter calculation because a Coulomb potential has a longer tail and the calculation cannot be interrupted halfway. This method, however, lacks strictness in calculation.

Figure 11:
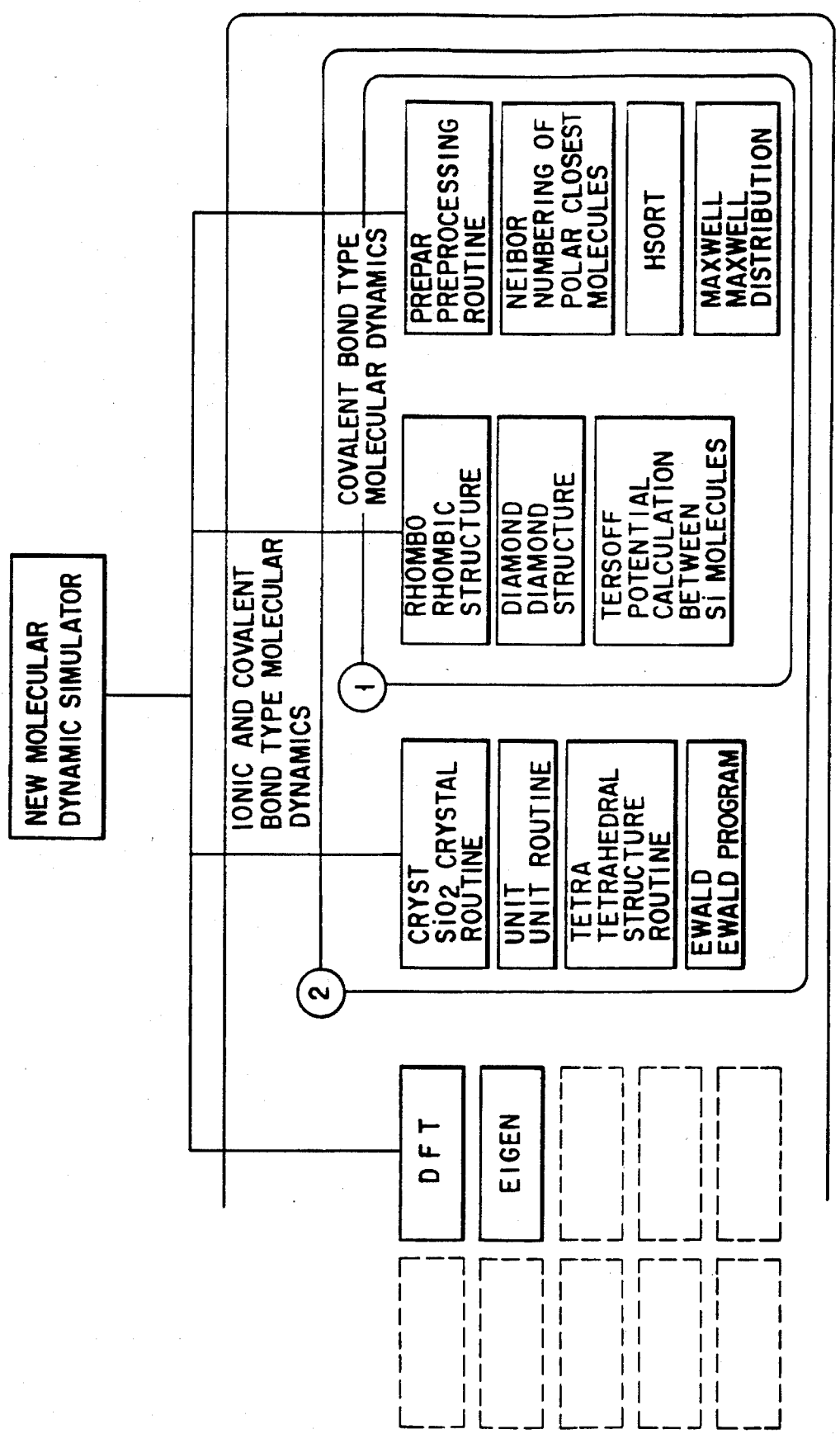
FIG. 11 is a chart showing a new molecular dynamic simulation according to the present invention.
Figure 12:
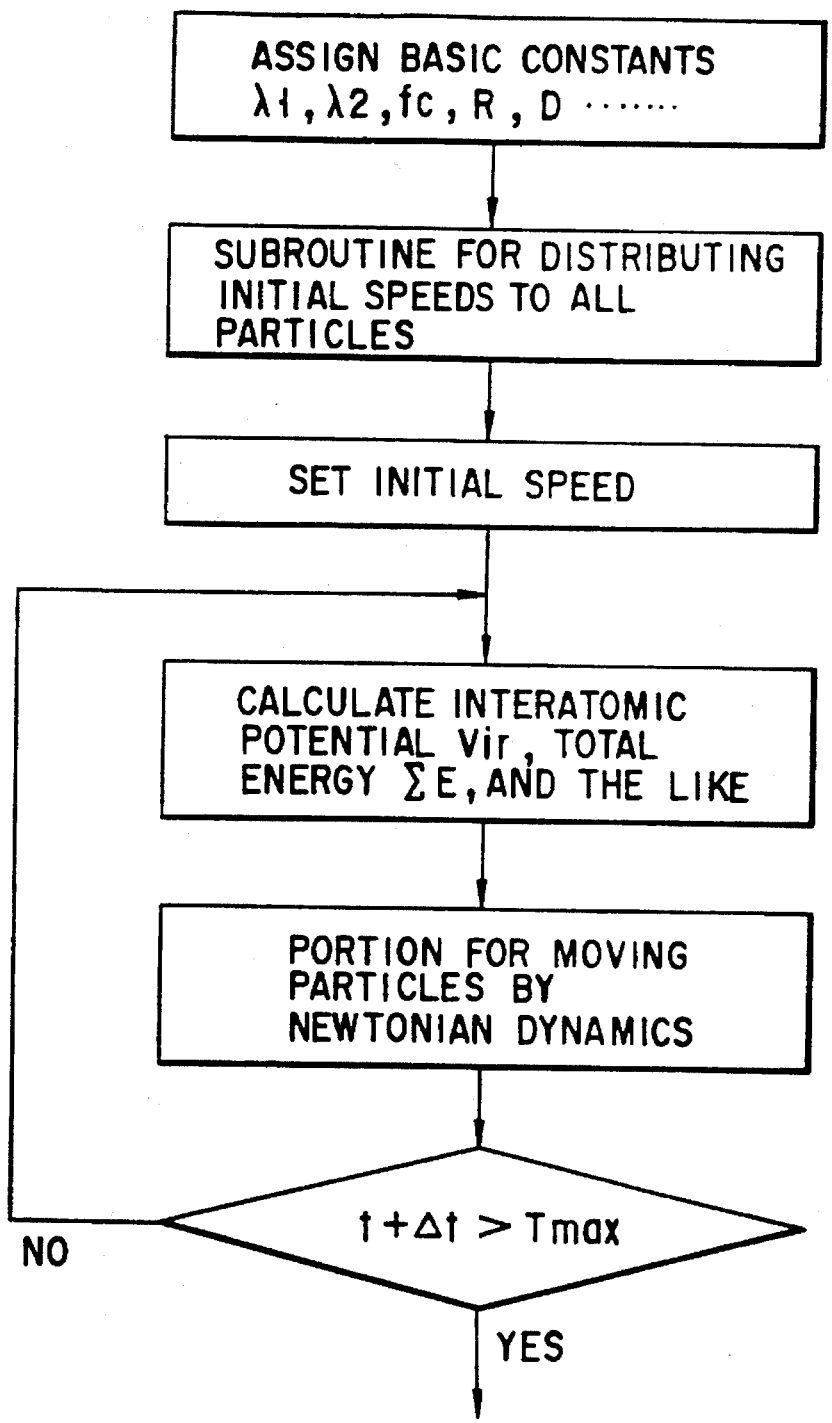
FIG. 12 is a flow chart showing the new molecular dynamic simulation according to the present invention.

The overall arrangement of a new molecular dynamic simulation proposed by the present inventors is shown in FIG. 11. The major points of this simulation system will be described with reference to FIGS. 11 and 12.

The improvements and new points of the calculation procedures will be described to compare with a conyentional method. As initial states, a particle configuration and the like are determined. The initial states are "CRYST" "TETRA" "RHOMBO" and "DIAMOND" which are equivalent to the conventional method.

The equation of motion is solved using "TERSOFF" and "EWALD" to calculate the direction and magnitude of a force acting between particles. The position of each particle in the next moment is then calculated. This procedure is continued for a predetermined process time.

The potential obtained by the present inventors from the first principle was used for Si for a potential expression serving as the basis of the equation of motion. Simultaneous equations of the equation of motion and the Lagrangian are used to solve problems at constant volume/constant pressure. In addition, the simulator is arranged to allow a discussion on the energy of a system as a whole as a target object. Outputs include a spontaneously changing position, speed, force, and the like of each particle. It is also possible to perform an animated display using computer graphics.

The potential used in an oxide film calculation is proposed in a variety of technical fields, but cannot be directly used. Am ionic component greatly contributes to a force acting on each atom in the oxide film. Convergence of the ionic component force is slow, and therefore the calculation result depends on the calculation size.

In order to prevent the above inconvenience, the present inventors referred to the Ewald's original text (P. Ewald, "Die Berrechnung optischer und electrostatischer Gitterpotentiale", Ann. Phys., Vol. 64, p. 253 (1921)) which dealt this problem mathematically, and developed a strict equation.

Figure 13:
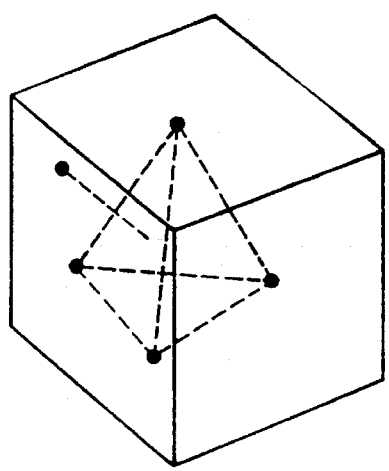
FIG. 13 is a view showing the negative tetraatomic Madelung potential of an $SiO_4$ cluster.

As shown in equation (1) and FIG. 13, a potential $\Phi_{ij}$ consists of the Coulomb force (first term), the repulsive force (second term) between inner-shells, and the covalent bond correction term (third term). To accurately accumulate the values within a crystal, the present inventors developed a strict reciprocal lattice accumulation equation, some components of which are defined in equations (2) to (6) below, where i and j are the particle numbers corresponding to oxygen and Si atoms respectively, N is the total number of particles, and r, m, n, and L are the distance vector, the reciprocal lattice vector, the unit vector, and the unit lattice vector, respectively.

$$\Phi_{ij}(r) = \frac{Q_i Q_j}{r} + f_o(b_i + f_j)\exp\left[\frac{a_i + a_j - r}{b_i + b_j}\right] - \frac{C_i C_j}{r^6} \quad (1)$$

As for the potential accumulation which is slow in convergence, the presence of $\phi(4)$ represented by equation (6), which serves as the fourth constant term, is derived in addition to the terms $\phi 1$, $\phi 2$, and $\phi 3$. In many conventional reports, this fourth term is omitted. However, an accurate calculation cannot be performed in the absence of the fourth term.

As described above, the Coulomb potential $Q_i Q_j/r$ is represented by the four terms in equation (2) below:

$$Q_i Q_j/r = 1/2 \sum_{i=1}^{N} \sum_{j=1}^{'} \Sigma Z_j Z_i / |\bar{n} + r_i - r_j| \quad (2)$$

$$\equiv \Phi^{(1)} + \Phi^{(2)} + \Phi^{(3)} + \Phi^{(4)}$$

In addition, the respective elements are defined by equations (3) to (6) as follows:

$$\Phi^{(1)} = 1/2 \sum_{i=1}^{N} \sum_{j=1}^{'} \Sigma Z_j Z_i / |\bar{n} + r_j - r_i| \cdot erfc(\kappa |\bar{n} + r_j - r_i|) \quad (3)$$

$$\Phi^{(2)} = 1/2(L_x L_y L_x) \sum_{m}^{'} 1/|m|^2 \cdot \exp[-\pi^2|m|^2/\kappa^2] \cdot \quad (4)$$

$$((\Sigma Z_i \cos[2\pi m r_i])^2 + (\Sigma Z_i \sin[2\pi m r_i])^2)$$

$$\Phi^{(3)} = -\kappa/\sqrt{\pi} \cdot \Sigma Z_i^2 \quad (5)$$

$$\Phi^{(4)} = 2\pi/(3L_x L_y L_x) \left| \sum_{i=1}^{N} Z_i r_i \right|^2 \quad (6)$$

where $\bar{n} = n_x \cdot (L_x, 0, 0) + ny \cdot (0, Ly, 0) + n_z \cdot (0, 0, L_z)$, $\bar{m} = m_x \cdot (1/L_x, 0, 0) + m_y \cdot (0, 1/L_y, 0) + m_z \cdot (0, 0, 1/L_z)$ The Coulomb potential is obtained as follows. The present inventors found that the Coulomb potential could be decomposed into four terms. In particular, only three terms are taken into consideration in the conventional techniques. The present inventors confirmed that the fourth term should be taken into consideration. The calculation procedures will be described below.

The present inventors start to solve the following basic equation (7) as the starting point for a strict equation in consideration of the dielectric constant:

$$V(\epsilon=\infty)=V(\epsilon=1)-2\pi/3L^3|\Sigma_i Z_i r_i|^2 \quad (7)$$

The Coulomb potential in a conductor $\epsilon=\infty$ is different from that in a vacuum $\epsilon=1$. L is one side of a unit crystal (cubic crystal), $\Sigma$ is calculated within the unit crystal, and $\Sigma_i$ and $r_i$ are the charge and position of the with particle, respectively. The inner surface of the sphere is polarized by the charge inside the sphere. A dipole layer is formed on the inner surface of a non-conductive sphere, but the last term in equation (7) cancels this effect. The Ewald's method gives the left-hand side for $\epsilon=\infty$. To obtain a value in a vacuum, the final term of the above equation must be added. Only the result is given herein.

The Coulomb potential is expressed by equation (8):

$$\Phi = \frac{1}{2} \sum_{i=1}^{n} \sum_{j=1}^{n} {}' \Sigma Z_i Z_j / (|\bar{n} + r_j - r_i|) \quad (8)$$

where n is the number of atoms in the unit crystal, r; and Z; are the position and charge of the first atom within the unit crystal, and $\bar{n}$ is the vector for designating a crystal periodically shifted from the unit crystal, which vector is defined by equation (9):

$$\bar{n} = n_x Z_x + n_y Z_y + n_z Z_z \quad (9)$$

where $Z_x$, $Z_y$, and $Z_z$ are side vectors in the $\underline{x}$, $\underline{y}$, and $\underline{z}$ directions, respectively, and $n_x$, $n_y$, and $n_z$ are integers of $-\infty$ to $+\infty$ (for a bulk crystal), respectively. The prime of $\Sigma'$ indicates that j=i is excluded for n=0.

The present inventors introduce a new F function represented by equation (10) below:

$$F(r) = \int_0^\infty 2/\sqrt{\pi} \sum_{j=1}^{N} \Sigma Z_j \cdot \quad (10)$$

$$\exp[-|\bar{n} + r_j - r|^2 t^2]dtm \int_0^\infty G(\bar{r}, t)dt$$

where $G(\bar{r},t)$ Is a periodic function of $\bar{r}$. The present inventors found that this function could be expressed as a Fourier series.

$G(\bar{r},t)$ can be rewritten to be expressed by equation (11) below:

$$G(\bar{r},t) = 2\pi/(L_x + L_y + L_z) \sum_{j=1}^{N} \Sigma \cdot \quad (11)$$

$$\exp[-\pi^2|\bar{m}|^2 + 2\pi i \bar{m}(\bar{r} - \bar{r}_j)]$$

where $\bar{m}$ is the reciprocal lattice vector which is then expressed by equation (12) as follows:

$$\bar{m} = m_x(1/L_x, 0, 0) + m_y(0, 1/L_y, 0) + m_z(0, 0, 1/L_z) \quad (12)$$

where exponents $m_x$, $m_y$, and $m_z$ are integers from $-\infty$ to $+\infty$. If $\bar{m}=\bar{o}$, then $\exp[-\pi^2|\bar{m}|^2+2\pi i \bar{m}(\bar{r}-\bar{r}_j)]$ and $\Sigma Z_j=0$. If the total charge within the unit crystal is zero, the term $\bar{m}=m$ is eliminated. When the term $\bar{m}=m$ is eliminated beforehand, equation (13) is obtained.

The present inventors divide an integration range with $\underline{k}$, and two $G(\bar{r}, t)$ forms are selectively used to obtain equation (14) below:

$$G(r,t) = 2\pi/(L_x+L_y+L_z) \sum_{j=1}^{N} {\sum_{m}}' Z_j/t^3 \cdot \exp[-\pi^2|\bar{m}|^2 + 2\pi i m(r-r_j)] \quad (13)$$

$$F(r) = \int_0^k 2\pi/(L_x+L_y+L_z) \sum_{j=1}^{N} {\sum_{m}}' Z_j/t^3 \cdot \exp[-\pi^2|\bar{m}|^2 + \sqrt{\pi}\ \overline{im}(\bar{r}-\bar{r}_j)] \quad (14)$$

$$\int_k^\infty 2/\sqrt{\pi} \sum_{j=1}^{N} {\sum_{m}}' Z_j \cdot \exp[-|\bar{n}+\bar{r}_j-\bar{r}|t^2]dt$$

in this case, equations (15) are used as formulas:

$$\int_0^k 1/t^3 \cdot \exp[-a^2/t^2]dt = 1/2a^2 \cdot \exp[-a^2/k^2] \quad (15)$$

$$\int_k^\infty 1/\sqrt{\pi} \cdot \exp[-b^2 t^2]dt = 1/b \cdot erfc(kb)$$

The initial Coulomb potential is represented by equation (16) below:

$$\Phi = 1/(L_x+L_y+L_z) \sum_{j=1}^{N} {\sum_{m}}' Z_j/|\bar{m}|^2 \cdot \exp[-\pi^2|\bar{m}|^2/\kappa^2] \cdot \cos[2\pi\bar{m}(\bar{r}-\bar{r}_j)] + \quad (16)$$

$$1/2 \sum_{i=1}^{N} {\sum_{n}}' Z_j Z_i/|\bar{n}+\bar{r}_j-\bar{r}| \cdot erfc(\kappa|\bar{n}+\bar{r}_j-\bar{r}|) +$$

$$1/2 \sum_{i=1}^{N} Z_i \{\lim_{\bar{m}} \{Z_i/|r_i-r| \cdot erfc(\kappa|\bar{r}_i-\bar{r}|) - Z_i/|\bar{r}_i-\bar{r}|\}$$

wherein the prime of $\Sigma'$ indicates that $j=i$ is excluded for $\bar{n}=\bar{o}$.

In addition, equation (17) is established:

$$1/2 \sum_{i=1}^{N} Z_i \lim_{s\to 0} Z_i/s(2/\sqrt{\pi} \int \exp(-t^2)dt - 1) = \quad (17)$$

$$1/2 \sum_{i=1}^{N} Z_i^2 \lim_{s\to 0} (2/\sqrt{\pi}\ \kappa\exp(-\kappa^2 s^2)) = -\kappa/\sqrt{\pi} \sum_{i=1}^{N} Z_i^2$$

Equation (17) does not contain $\bar{r}$ and is not related to a force. Equation (17) can be rewritten as equation (18) below:

$$\sum_i \sum_j Z_i \cdot Z_j \cdot \cos[2\pi m(r_i-r_j)] = \quad (18)$$

$$\sum_{i=1}^{N} Z_i \cdot \cos[2\pi m r_i] \sum_{j=1}^{N} Z_j \cdot \cos[2\pi m r_j] +$$

$$\sum_{i=1}^{N} Z_i \cdot \sin[2\pi m r_i] \sum_{j=1}^{N} Z_j \cdot \sin[2\pi m r_j] =$$

$$\left(\sum_{i=1}^{N} Z_i \cdot \cos[2\pi m r_i]\right)^2 + \left(\sum_{i=1}^{N} Z_i \cdot \sin[2\pi m r_i]\right)^2 =$$

-continued $$1/(L_x+L_y+L_z) \sum_{j=1}^{N} {\sum_{m}}' Z_j/|m|^2 \cdot \exp[-\pi^2|m|^2\kappa^2] \cdot$$

$$\left(\sum_{i=1}^{N} Z_i \cdot \cos[2\pi m r_i]\right)^2 + \left(\sum_{i=1}^{N} Z_i \cdot \sin[2\pi m r_i]\right)^2$$

In summary, the Coulomb potential is represented by equations (19), (20), (21), (22), and (23):

$$\Phi = 1/2 \sum_{i=1}^{N} {\sum_{j=1}}' \sum_n Z_j Z_i/|n+r_i-r_j|m\Phi^{(1)} + \Phi^{(2)} + \Phi^{(3)} \quad (19)$$

$$\Phi^{(1)} = 1/2 \sum_{i=1}^{N} {\sum_{j=1}}' \sum_n Z_j Z_i/|n+r_j-r| \cdot erfc(\kappa|n+r_j-r|) \quad (20)$$

$$\Phi^{(2)} = 1/2(L_x L_y L_z) {\sum_m}' 1/|m|^2 \cdot \exp[-\pi^2|m|^2/\kappa^2] \cdot \quad (21)$$

$$((\sum Z_i\cos[2\pi m r_i])^2 + (\sum Z_i\sin[2\pi m r_i])^2)$$

$$\Phi^{(3)} = -\kappa/\sqrt{\pi} \cdot \sum Z_i^2 \quad (22)$$

$$\Phi^{(4)} = 2\pi/(3L_x L_y L_z) \left|\sum_{j=1}^{N} Z_i r_i\right|^2 \quad (23)$$

where $\bar{n}$ is defined by $\bar{n}=n_x\cdot(x,0,0) + n_y\cdot(0,L_y,o) + n_z\cdot(0,0,L_z)$, and $\bar{m}$ is defined by $\bar{m}= m_x\cdot(1/L_x,0,0)+m_y\cdot(0,1/L_y,0)+m_z\cdot(o,0,1/L_z)$.

The expressions of equations (19) to (23) are advantageous in that the original $\Sigma$ term is attenuated on the order of a reciprocal, but the $\Sigma$ terms in $\Phi^{(1)}$ and $\Phi^{(2)}$ are rapidly attenuated by the erfc and exp factors, respectively. In $\Phi^{(3)}$, the $\Sigma$ term acts in reverse proportion to the attenuation speed, and a proper $\kappa$ must be selected to establish the balance. This is obtained by calculating contribution of the Coulomb forces from a shorter distance to a longer distance, assuming that the ambient environment is constituted by a conductor.

If the ambient environment is a vacuum, another term is added, which term has never been taken into consideration in the conventional techniques.

Figure 14:
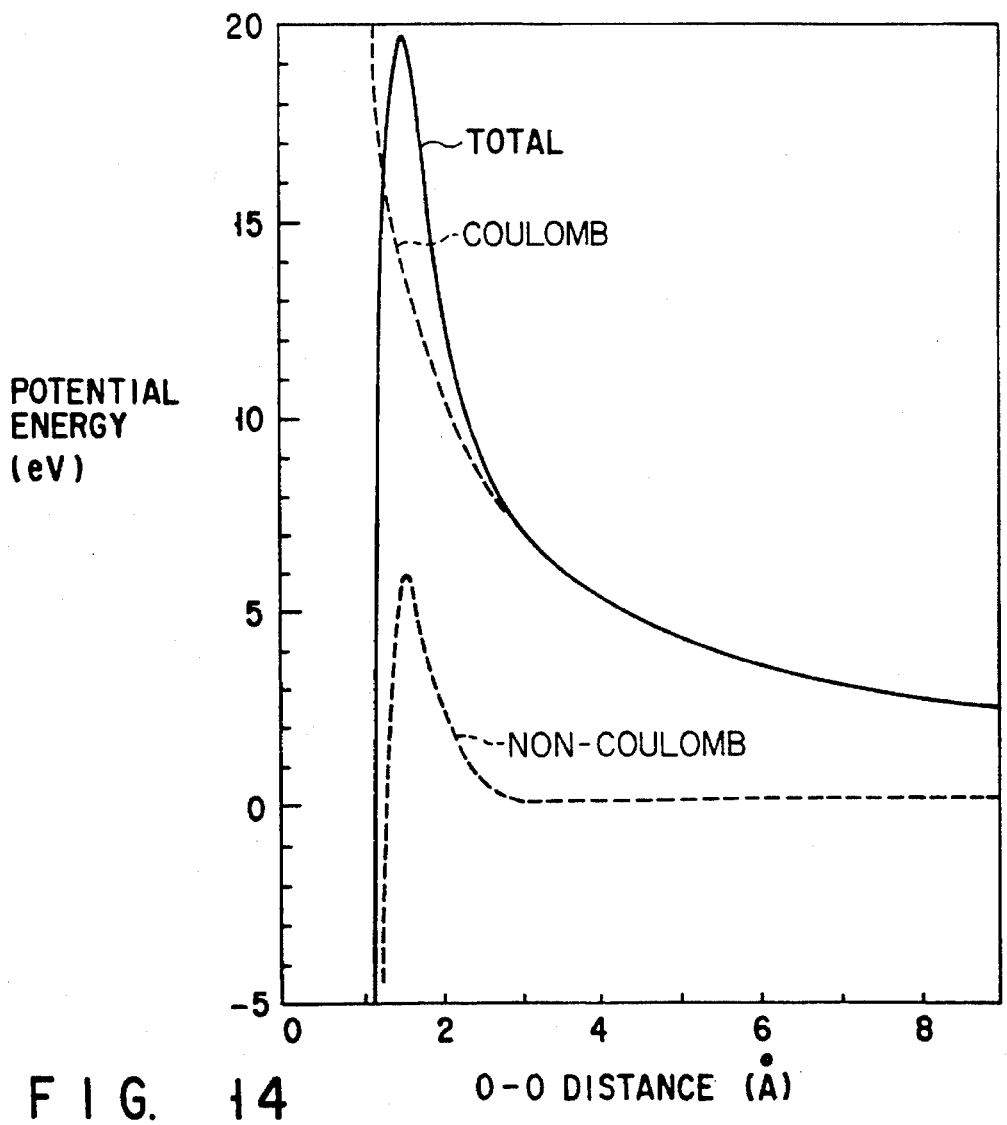
FIG. 14 is a graph showing the relationship between the O—O distance and the potential energy.
Figure 16:
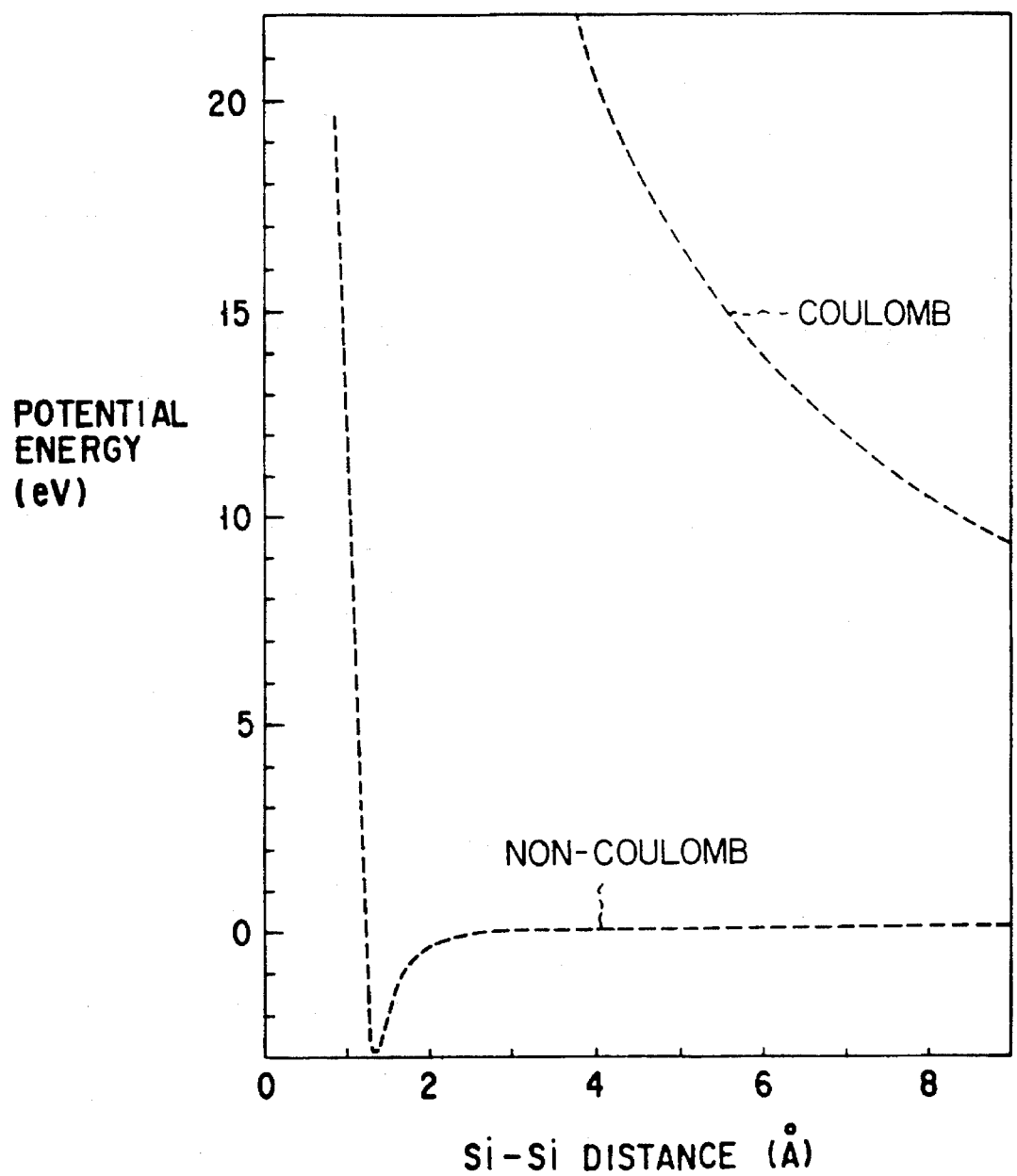
FIG. 16 is a graph showing the relationship between the Si—Si distance and the potential energy.
Figure 21:
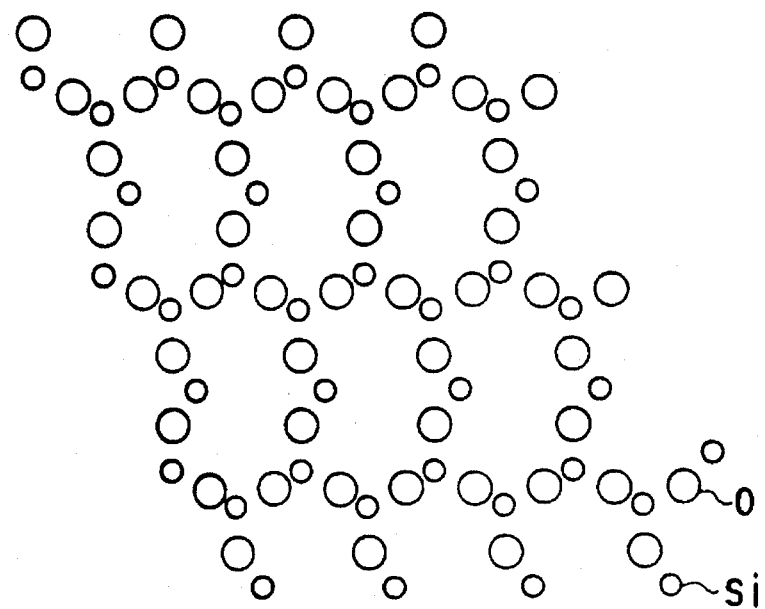
FIG. 21 is a view showing an atomic configuration of quartz.
Figure 22:
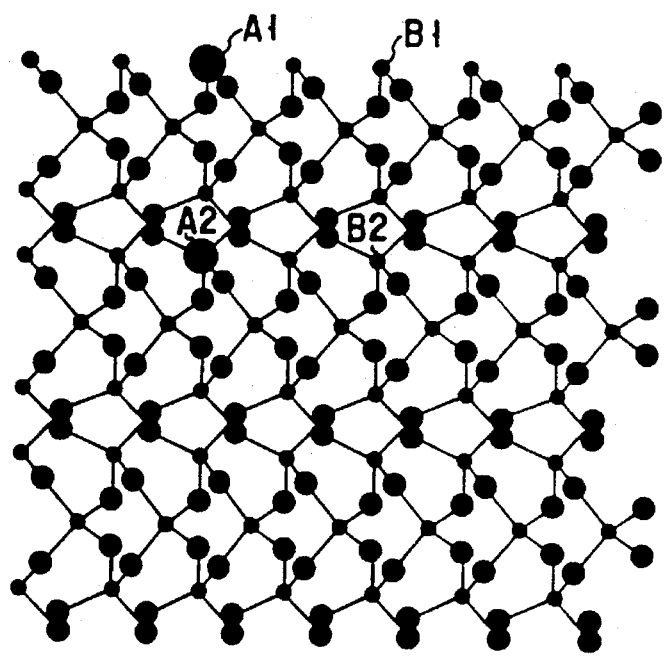
FIG. 22 a view showing another atomic configuration of quartz.

Strict outputs according to the present invention are shown in FIGS. 14, 15, and 16.

Rotation point groups formed by the present inventors are shown in FIGS. 17 and 18. More specifically, an Si atom is located at the center (0,0,0) of a sphere having a radius $\underline{r}$, and four oxygen atoms (one or two oxygen atoms are shown) are located at the vertex positions of a regular tetrahedron on the sphere. The position of the C oxygen atom is designated by an Eulerian angle ($\theta$, $\phi$). To express this position in the (x,y,z) coordinate system, the position is rotated through an angle $\theta$ about the y-axis and then an angle $\phi$ about the z-axis with respect to a vector (O,O,$\gamma$) directed toward the north pole.

A rotation matrix for this is represented by equation (24) below:

$$R(\theta,\phi) = \begin{bmatrix} \cos\phi & \sin\phi & 0 \\ -\sin\phi & \cos\phi & 0 \\ 0 & 0 & 1 \end{bmatrix} \times \begin{bmatrix} \cos\theta & \sin\theta & 0 \\ 0 & 1 & 0 \\ -\sin\theta & 0 & \cos\theta \end{bmatrix} = \quad (24)$$

$$\begin{bmatrix} \cos\phi\cos\theta & \sin\phi & \cos\phi\sin\theta \\ -\sin\phi\cos\theta & \cos\phi & -\sin\phi\cos\theta \\ -\sin\theta & 0 & \cos\theta \end{bmatrix}$$

If one of the four oxygen atoms is located at the north pole (O,*) and θ is indefinite (*), the positions of the remaining oxygen atoms are represented by (109° 28', φ), (109° 28', φ+120°), and (109° 28', φ+240°) using an indeterminate angle φ, respectively. The x-, y-, and z-coordinates of these positions are represented by expression (25) by applying $\cos\theta = -1/3$ and $\sin\theta = 2(2)^{1/2}/3$ and φ+120° and φ+240° derived from φ in equation (25) to +(8):

$$r\begin{bmatrix} 2\sqrt{(2)/3}\cos\phi \\ -2\sqrt{(2)/3}\sin\phi \\ -1/3 \end{bmatrix}, r\begin{bmatrix} 2\sqrt{(2)/3}\cos(\phi+120) \\ -2\sqrt{(2)/3}\sin(\phi+120) \\ -1/3 \end{bmatrix}, \quad (25)$$

$$r\begin{bmatrix} 2\sqrt{(2)/3}\cos(\phi+240) \\ -2\sqrt{(2)/3}\sin(\phi+240) \\ -1/3 \end{bmatrix}$$

To direct the first oxygen atom pointing the $Z_{ax13}$ to the direction of R(θ,φ) in equation (24) is directly applied. As a result, the present inventors obtain the x-, y-, and z-coordinates of the four oxygen atoms, as indicated by expression (26):

$$R(\phi,\theta)\begin{bmatrix} 0 \\ 0 \\ r \end{bmatrix} \quad (26)$$

$$rR(\phi,\theta)\begin{bmatrix} 2\sqrt{(2)/3}\cos(\phi) \\ -2\sqrt{(2)/3}\sin(\phi) \\ -1/3 \end{bmatrix}$$

$$rR(\phi,\theta)\begin{bmatrix} 2\sqrt{(2)/3}\cos(\phi+120) \\ -2\sqrt{(2)/3}\sin(\phi+120) \\ -1/3 \end{bmatrix}$$

$$rR(\phi,\theta)\begin{bmatrix} 2\sqrt{(2)/3}\cos(\phi+240) \\ -2\sqrt{(2)/3}\sin(\phi+240) \\ -1/3 \end{bmatrix}$$

When the x-, y-, and z-coordinates of the four Si atoms within the unit lattice are represented by parameters a, b and c:

I (0,0,0)

II (a,b,c)

III (a−b,a+b,2c)

IV (−b,a,3c)

V (0,0,4c)

More specifically, when the first atom is located at the origin and the Z-coordinate is orthographically projected while incrementing it every predetermined value c, a square defined by coordinates I, II, III, and IV is formed. The fifth atom is located immediately above the first atom because it is the first atom of the next unit lattice and its z-coordinate is increased by 4c. The configuration of the four oxygen atoms belonging to each Si atom is rotated every 90° about the z-axis with respect to the Si atom. In addition, the above-mentioned Si atom movement is added. The coordinates represented by equation (24) can be directly used as the x-, y-, and z-coordinates of the four oxygen atoms around the first Si atom. The x-, y-, and z-coordinates of the oxygen atoms around the second, third, and fourth Si atoms can be obtained such that R(0,90°) rotation and (a,b,c) translation;

R(0,180°) rotation and (a−b, a+b,2c) translation; and

R(0,270°) rotation and (−b,a,3c) translation.

In addition, the pairs II1 and III2, III1 and IV2, and IV1 and V2 are identical oxygen atoms. These oxygen atoms hold the same relations, as a matter of course. The oxygen atoms I1 and II4 are shifted by one period 2a in the horizontal direction.

The regions and the like used in the calculations will be described in more detail. In the above calculations, several tens of atomic layers are assumed in the direction of depth on the Si substrate side, and several tens of atomic layers are also assumed in the rear direction on the surface, thereby assuring the calculation regions. Each of the length, width, and height in the β-cristobalite is also defined by several tens of atomic layers.

A long history and numerous data are present in the study of the cause for degradation of an oxide film. According to the present invention, the above calculation technique is used to study the movement of atoms and electrons to clarify the cause for degradation of the oxide film. The present invention is also to perform theoretical identification of measurement results such as FT-IR measurement results used in a variety of application fields in recent years.

In addition, the present inventors examined the defect density allowance in consideration of an actual gate oxide formation process. That is, 3,200 Si atoms and 6,400 oxygen atoms were prepared, and 0 to 100 oxygen defects were formed. In this case, the distributions of the O-Si-O angle and the Si-O distance were obtained from the spontaneously changing Si and oxygen atom positions. The results are shown in FIGS. 19 and 20.

The following facts were found from the results in FIGS. 19 and 20. The relationship between the oxygen and Si atom behaviors and the oxide film structure factors was examined, when an oxygen-vacancy defect is present in a monocrystalline oxide film, the Si and oxygen atoms positioned far beyond the defect are also disturbed the more as compared with non-defective distribution. And at the same time, the mobility of point defects is greatly high. When these behaviors are compared with that of monocrystalline Si, the behavior of the oxide film is found to have a larger influence and range than those of monocrystalline Si. Such an active behavior may be caused by a large number of ionic bond components which are present in the oxide film and are easily susceptible to polarization, so that a local deficiency triggers a change in potential. The present inventors examined the potential change in accordance with the above procedures and found that the advantages of the monocrystalline insulating film could be sufficiently exhibited at an oxygen defect density of 0.01% or less.

The calculation of equation (4) corresponds to a kind of Fourier transform, which can be realized by a larger number of trigonometric functions. According to this equation (4), all the combinations of the number of particles and the number of reciprocal lattices must be calculated, with general-purpose computers available at present, the calculation speed for the trigonometric functions is very low, and a maximum decrease in the number of calculations leads to a high-speed operation. The present inventors paid attention to these points.

That is, when r is defined as 2 ($a_x$, $a_y$, $a_z$), term COS ($2\pi mF$) can be rewritten into the form of term $\cos(m_x a_x + m_y a_y + m_z a_z)$. In this case, since $m_x$, $m_y$, and $m_z$ are integers, the computer program is very complicated. However, when the addition theorem is repeated, the above term can be developed into equations (27) and (28) below:

$$\cos(m_x a_x + m_y a_y + m_z a_z) = \quad (27)$$

$$(\cos m_x a_x)(\cos m_y a_y)(\cos m_z a_z) - (\cos m_x a_x)(\sin m_y a_y)(\sin m_z a_z) -$$

$$(\sin m_x a_x)(\cos m_y a_y)(\sin m_z a_z) - (\sin m_x a_x)(\sin m_y a_y)(\cos m_z a_z)$$

$$\sin(m_x a_x + m_y a_y + m_z a_z) = \quad (28)$$

$$(\sin m_x a_x)(\cos m_y a_y)(\cos m_z a_z) - (\cos m_x a_x)(\sin m_y a_y)(\cos m_z a_z) -$$

$$(\cos m_x a_x)(\cos m_y a_y)(\sin m_z a_z) - (\sin m_x a_x)(\sin m_y a_y)(\sin m_z a_z)$$

In addition, equation (29) to (32) are established as follows:

$$\sin(2ma) = \quad (29)$$

$$\sin a \sum_{r=0}^{m-1} (-1)^r/(r!) \left[ \prod_{k=r+1}^{2r} (2m-k) \right] (2\cos a)^{2m-2r-1}$$

$$\sin(2(m+1)a) = \quad (30)$$

$$\sin a \sum_{r=0}^{m-1} (-1)^r/(r!) \left[ \prod_{k=r+1}^{2r} (2m-k) \right] (2\cos a)^{2m-2r-1}$$

$$\cos(2ma) = \frac{1}{2}(2\cos a)^{2m} + \quad (31)$$

$$\sum_{r=1}^{m-1} (-1)^r m/(r!) \left[ \prod_{k=r+1}^{2r-1} (2m-k) \right] (2\cos a)^{2m-2}$$

$$\cos(2(m+1)a) = \frac{1}{2}(2\cos a)^{2m+1} + \quad (32)$$

$$\frac{1}{2} \sum_{r=1}^{m-1} (-1)^r (2m+1)/$$

$$(r!) \left[ \prod_{k=r+1}^{2r-1} (2m-k+1) \right] (2\cos a)^{2m-2r+1}$$

Although the program size increases by about 10 times from 84 lines to 895 lines, the calculation time can be reduced to about half from 13.32 minutes to 6.51 minutes in a typical case using a Cray-YMP. The reduction in calculation time makes the present invention practical.

The present inventors paid attention to elastic energy. The junction structure of the present invention was found to have a minimum elastic energy. The elastic energy was obtained as follows.

Assume that the lattice sizes of Si and an oxide film are defined as $d_O^{Si}$ and $d_O^{SiO2}$, respectively. Also assume that the distance upon maximum shrinkage or expansion at the interface between the Si and the oxide film is defined as $1.64d_0-2X$ where $d_o$ is a lattice constant and X is an unknown value which represents that the shrinkage or expansion and is shared by the Si and the oxide film. This way of movement influences four atoms of the 12 (=4×3) second closest atoms to increase the distance. This increased distance is defined as $d_0+ \epsilon^2$ ($\epsilon$: dielectric constant). If the four atoms are fixed, the calculation ends here. However, farther atoms also move, and the distances between the three closest atoms and the third closest atoms become $d_0+\epsilon^3$. Similarly, atoms up to the sixth closest atoms are taken into consideration. The sixth closest atoms are defined to be stationary. The elongations from $d_0$ form a geometric progression having a common ratio of ½. That is, the following relations are obtained:

A free energy H caused by distortion is defined as equation (33):

$$H = \sum_{n=2}^{n=6} 4 \times 3^{n-2} D\{1 + \exp(-2\alpha \epsilon_2/2^{n-2}) - 2\exp(-\alpha \epsilon_2/2^{n-2})\} \quad (33)$$

where D is deformation energy per unit strain, $\alpha$ is a constant and $\epsilon_2$ is $\epsilon/2$.

A substitution of the above relations into equation (33) yields equation (34) below:

$$H=2D\{1+\exp[-2\alpha(0.64d_O-2X)-2\exp[-\alpha(0.64d_O-2X]\}) -2D\{1+\exp(-2\alpha\times0.64d_O)-2\exp(-\alpha\times0.64d_O)\} \quad (34)$$

In equation (34), is in the braces cancel each other to yield equation (35):

$$H=2D\{\exp[-2\alpha(0.64d_O-2X)]-2\exp[-\alpha(0.64d_O-2X)] -\exp(-2\alpha\times0.64d_0)+2\exp(-\alpha\times0.64d_0)\} \quad (35)$$

Embodiments according to the first aspect of the present invention will be described below.

The above embodiment has exemplified the β cristobalite and the Si oxide film. However, the present invention can use quartz in place of these materials. Practical examples are shown in FIGS. 21 to 25.

Some of the examples will now be described with reference to FIGS. 23A, 23B and 24. In each figure, a small sphere represents an Si atom and a large sphere represents an O atom. It is also understood from the figures that each crystal has the 4-coordination of Si.

Figure 23A:
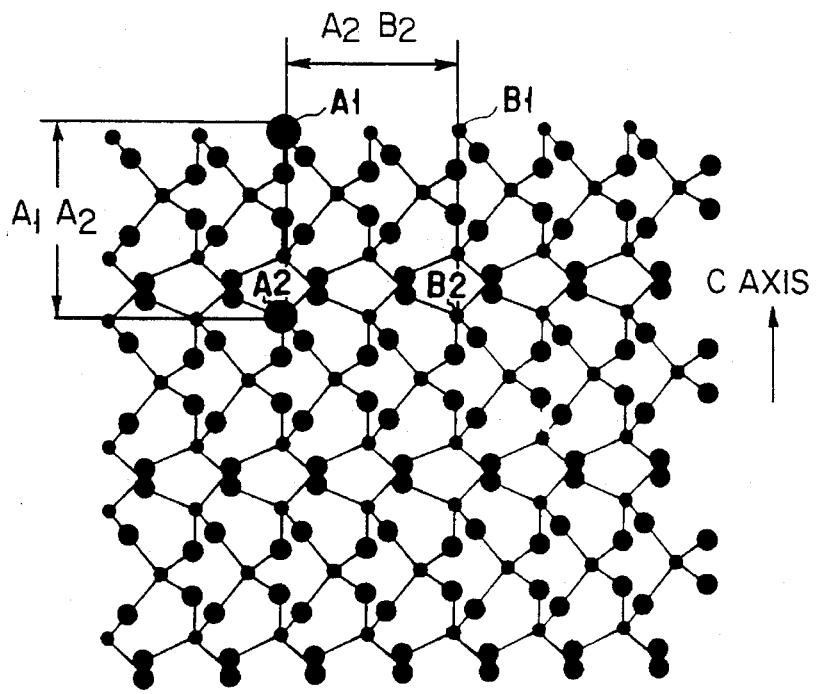
FIGS. 23A and 23B are views showing still another atomic configuration of quartz.

FIG. 23A will be explained further in detail. FIG. 23A shows a crystal arrangement of quartz analyzed by a novel molecular dynamics simulator developed by the inventors of the present invention. Shown in this figure, is a particular case where a plane of the quartz crystal including the C axis is perceived and the plane is rotated around the C axis by a certain angle. In the figure, all of A1, A2, B1 and B2 are designated to Si atoms in the structural elements of the quartz crystal. It is understood from the figure that A1, A2, B2 and B1 make substantially a square. It was also found that the dimensions of A1B2, A2B2, ... deviate from the Si—Si distance of an Si (100) plane only by 4%. With this plane, Si was grown by the method of the previous example using MBE, and it was confirmed, as the present invention indicates, that the Si (100) plane could be grown.

Figure 23B:
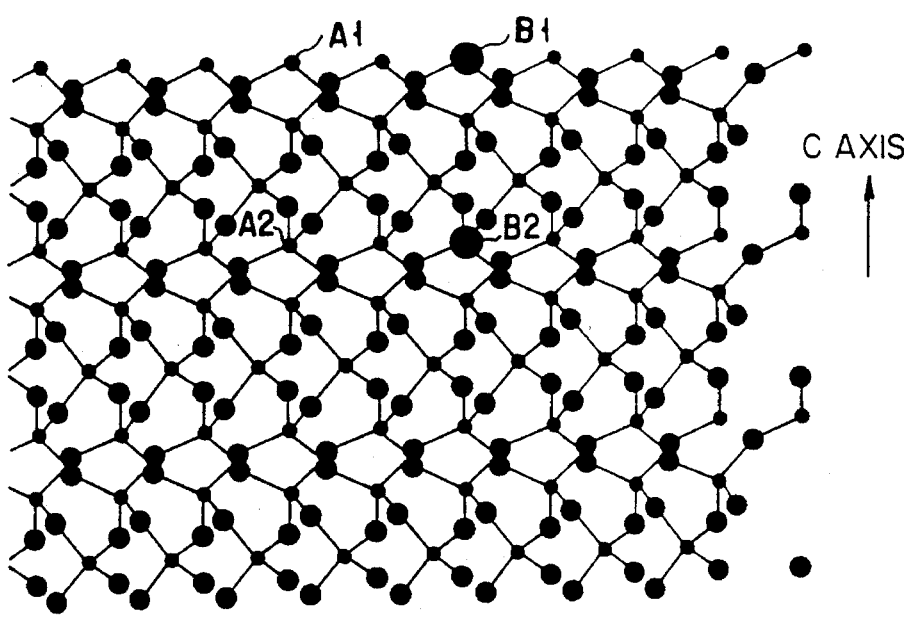

FIG. 23B shows another plane which includes the C axis. It was also found that there are three types of such planes, as the plane is rotated at every 60°.

Figure 24:
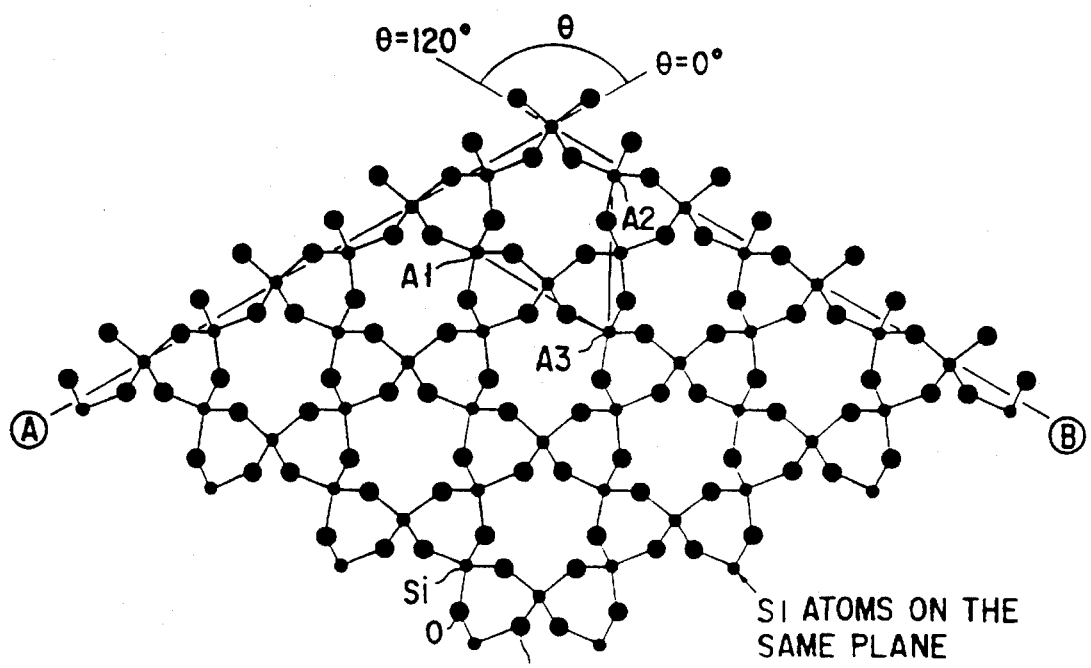
FIG. 24 is a view showing still another atomic configuration of quartz.
Figure 25:
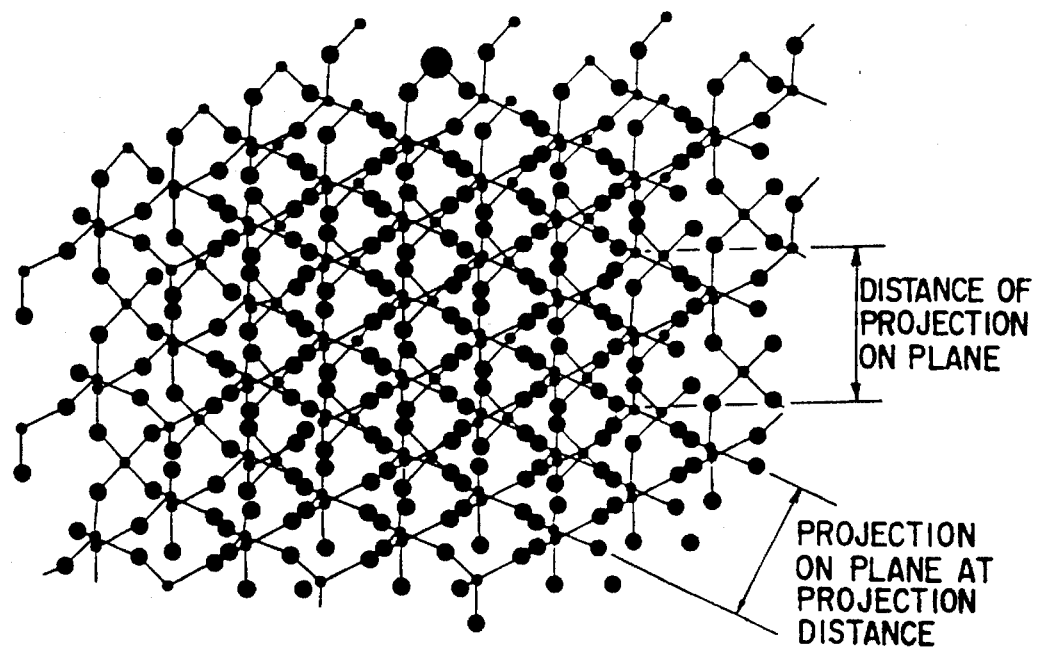
FIG. 25 is a view showing still another atomic configuration of quartz.

FIG. 24 will now be described. This figure shows the arrangement of quarts in the case where the crystal is cut along the plane vertical to the C axis. In the figure, all of A1, A2 and A3 are designated to Si atoms, and these three Si atoms are situated on the same plane. It was also found that this plane deviates from the Si (111) plane with respect to the Si—Si distance only by 5.1%. with this plane, Si was grown by the method of the previous example using MBE, and it was confirmed, as the present invention indicates, that the Si (100) plane could be grown.

In FIG. 24 also, a small sphere represents an Si atom and a large sphere represents an O atom.

In addition to an Si oxide film, a monocrystalline insulating film may consist of spinel ($MgAl_2O_4$), cerium oxide ($CeO_2$), strontium titanate ($SrTiO_3$), aluminum oxide ($Al_2O_3$), zirconium oxide ($ZrO_2$), yttrium oxide ($Y_2O_3$), yttrium-stabilized zirconium (YSZ), $PrO_2$, calcium fluoride ($CaF_2$), or a multilayered film thereof.

A silicon oxide film may be interposed at an interface between a monocrystalline insulating film and an underlying silicon wafer or underlying electrode.

Still another embodiment of the present invention will be described below. In this embodiment, the present inventors formed an artificial interface between monocrystalline Si and monocrystalline $SiO_2$ in accordance with molecular beam epitaxy (MBE). The procedures will be described in detail below.

The orientation of a cristobalite was examined using X-rays, marks were formed on a predetermined plane, and the cristobalite was cut on the basis of these marks. At this time, the cristobalite had a thickness of about 0.1 mm. This thickness must be minimum in consideration of the subsequent processes. However, the sample must be conveyed or mounted in accordance with molecular beam epitaxy (MBE), so a predetermined thickness is required. In this embodiment, the operations were performed using a 0.1 mm thick cristobalite. After monocrystalline Si was formed, the cristobalite was abraded to a predetermined thickness.

Figure 26A:
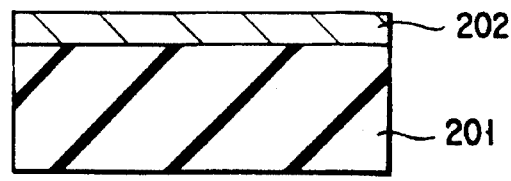
FIGS. 26A to 26C are sectional views showing the steps in manufacturing a MOS element having a monocrystalline gate oxide film according to the second embodiment of the first aspect of the present invention.

As shown in FIG. 26A, a monocrystalline Si film 202 was formed on a predetermined surface (the plane orientation is already slightly inclined) on a cristobalite plate 201 in accordance with MBE. In forming the film 202, the cristobalite plate 201 is placed in a preliminary chamber, and a gate valve was opened to convey the cristobalite plate 201 into a main chamber. The main chamber was then sufficiently evacuated and the cristobalite plate 201 was kept at 700° C. Si was then grown using a molecular beam. At this time, the states during the growth were sequentially observed.

The present inventors guided an electron beam on the growth surface at a very small angle, and the states during the Si growth were examined by electron beam diffraction. Clear diffracted spots representing the growth on the (100) plane were observed. The sample used in this embodiment is a structure in which Si is deposited on the cristobalite. This structure is vertically reversed with respect to a normal MOS structure.

The present inventors grafted monocrystalline Si on the MBE-grown Si to compensate for a very low Si film growth rate, which is an MBE disadvantage. At this time, special care was taken for the growth temperature of the grafted Si film due to the following reason. When the growth temperature is higher than 700° C., the properly formed interface may be damaged.

Figure 26B:
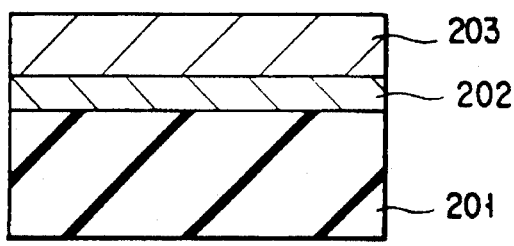

The following method may be proposed as the method of grafting the Si film on the monocrystalline Si film 202 having the structure shown in FIG. 26A. As shown in FIG. 26B, an amorphous Si film 203 was deposited to a thickness of about 1.3 μm at a temperature of about 580° C. The resultant structure was then put into a 600° C. furnace containing an inert atmosphere and annealed for about 30 minutes to convert the entire 1.3 μm thick amorphous Si film 203 into a single crystal.

This phenomenon is so-called solid-phase growth. To convert the grafted amorphous Si film 203 into a single crystal is to convert the amorphous Si film 203 into a single crystal using the MBE-grown monocrystalline Si serving as a seed crystal. This solid-phase grown is described in detail in Japanese Patent Application Nos. 4-111795, 4-191180, and 4-245289.

In addition, an Si substrate 204 was adhered on the structure shown in FIG. 26 A–C in accordance with an adhesion method. In this method, after the amorphous Si film 203 was formed by the CVD method, the Si substrate 204 was adhered. However, the CVD formation process of the amorphous Si film 203 may be omitted. The cross section at the interface between the monocrystalline Si and the oxide film was observed, and dislocations were found at a density of about $10^7/cm^2$.

The present inventors assumed that a dislocation-free interface could be formed in a very small interface area. In formation of an Si film in the above MBE growth experiment, the cristobalite surface was covered except for a square region having a predetermined area, and film growth was performed on only the square region having no cover. The area of the square region was variously changed. It was found that no dislocation was present when the length of one side of the square region was 0.1 μm or less. Therefore, it was found that the gate area could be formed to have a square area having one side of 0.1 μm or less in formation of a monocrystalline gate oxide film on monocrystalline Si.

Figure 26C:
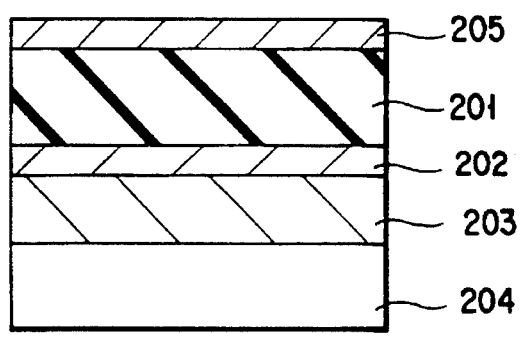

The present inventors turned the resultant structure upside down such that the cristobalite plate 201 faced up. The cristobalite plate 201 was abraded to obtain a monocrystalline oxide film having a thickness of about 10 μm. As shown in FIG. 26C, an aluminum film 205 was deposited as a gate electrode on this monocrystalline oxide film.

An electrode (not shown) was also formed on the Si substrate 204 having the structure shown in FIG. 26C to obtain a varactor. The CV evaluation of this MOS varactor was performed. More specifically, the distribution of an interface level was obtained from the frequency variance of the capacitance and compared with that of a conventional MOS structure. The interface levels was found to have reduced to 1/50. This indicates that the Si/SiO2 interface using the MOS structure of the present invention has a lower level than an $Si/SiO_2$ interface using a conventional thermal oxide film. A good interface was formed.

Figure 27:
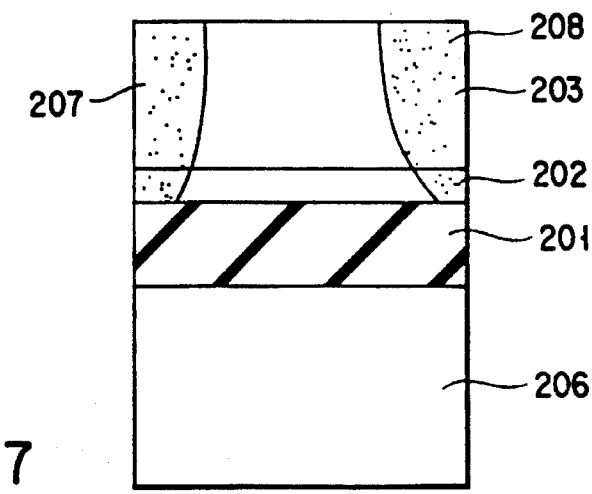
FIG. 27 is a sectional view showing the MOS element having the monocrystaline gate oxide film according to the present invention.

In the structure shown in FIG. 27, a gate electrode 206 consisting of poly-Si was formed on the cristobalite plate 201 side, source and drain regions 207 and 208 were formed in the Si layers 202 and 203, respectively, and source and drain electrodes (not shown) consisting of a refractory metal were formed on the source and drain regions 207 and 208, respectively, thereby forming a MOS transistor shown in FIG. 27.

The degradation characteristics of the cristobalite of this MOS transistor were measured at a high voltage and compared with those of a conventional MOS structure.

Figure 28:
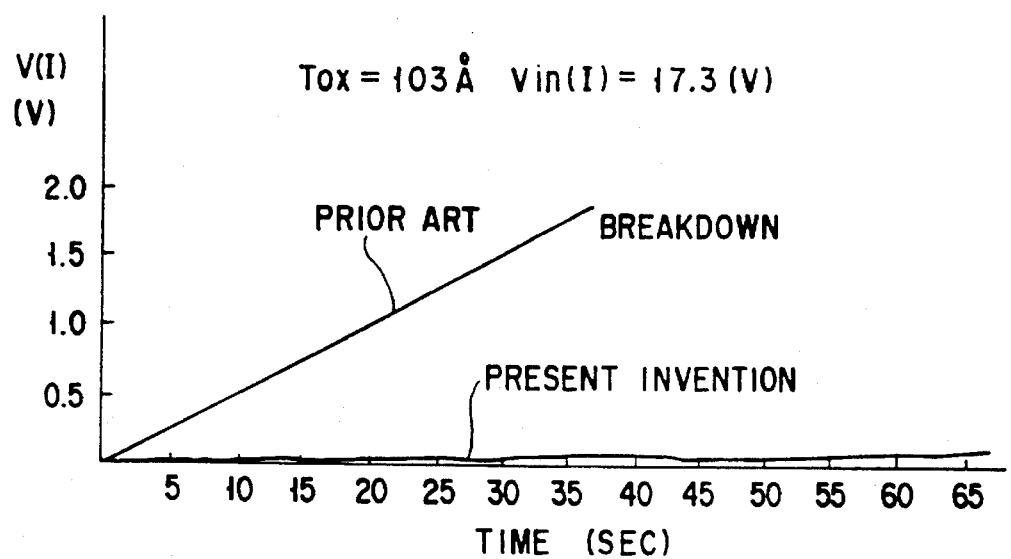
FIG. 28 is graph showing comparison between the characteristics of the MOS element having the monocrystalline gate oxide film according to the present invention and the characteristics of a conventional MOS element.

Specifically, FIG. 28 is a graph showing the breakdown voltage of a gate insulating film, covering the case where a high voltage was applied to the gate electrode, with respect to the conventional MOS structure using a thermal oxide film as a gate insulating film, and the MOS structure of the present invention using a gate insulating film made of cristobalite. As apparent from FIG. 28, the gate insulating film was broken down 37 seconds later in the conventional MOS structure. On the other hand, the MOS structure of the present invention was found to exhibit stable characteristics over a long period of time.

Figure 29:
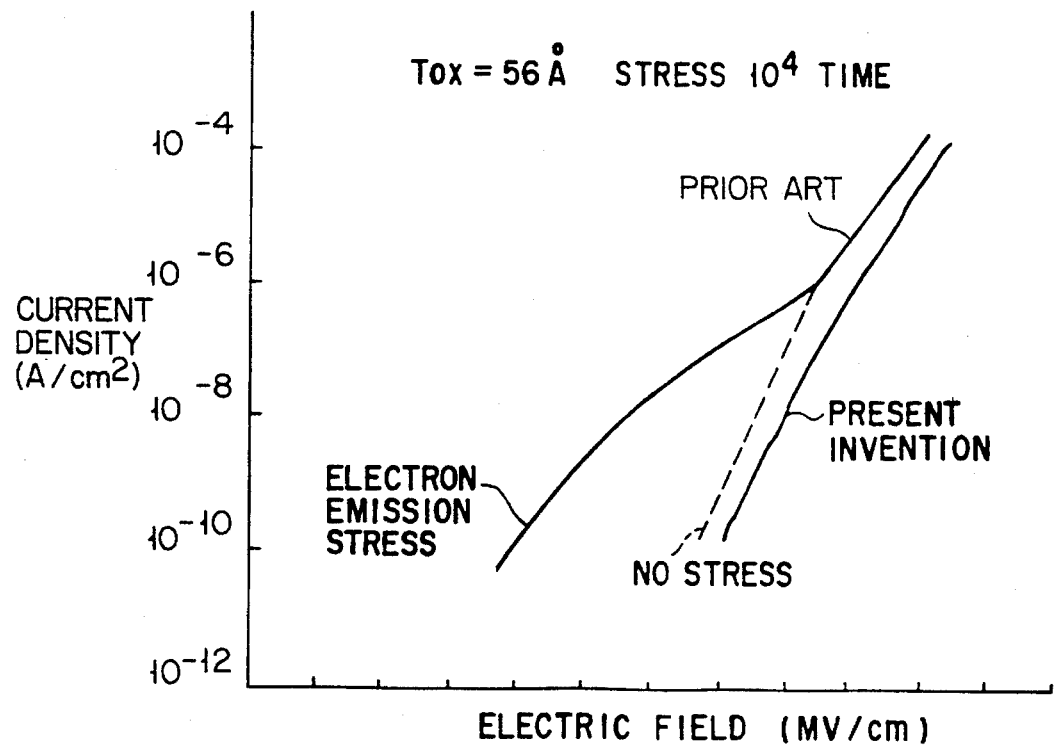
FIG. 29 is a graph showing comparison between the characteristics of the MOS element having the monocrystalline gate oxide film according to the present invention and the characteristics of a conventional MOS element.

FIG. 29 is a graph showing a change in current density relative to the electric field after application of an electric field stress to a gate insulating film. As apparent from FIG. 29, current flows even under a low electric field in the conventional MOS structure so as to lower the breakdown voltage of the gate insulating film. On the other hand, the MOS structure of the present invention was found to exhibit the current-electric field characteristics similar to those in the case where an electric field stress was not applied. In other words, FIG. 29 shows that the gate insulating film was not deteriorated at all in the MOS structure of the present invention by application of the electric field stress.

Still another embodiment of the present invention will be described below.

In a conventional method of manufacturing a MOS transistor, the surface of a monocrystalline silicon substrate is thermally oxidized, and the oxide film except for the gate region is removed. According to the method of the present invention, a mask is formed on the surface of the monocrystalline silicon substrate except for a gate region having an area, one side of which has a length of 1 μm. The cristobalite is formed on the gate region in accordance with MBE to form a gate oxide film. The mask is then removed, and ion implantation is performed on both the sides of the gate oxide film to form the source and drain regions. The cross section of the resultant gate structure was observed and formation of a dislocation-free interface surface was confirmed.

Problems of recent MOS elements will be briefly described below. A hard disk is most popular as an auxiliary memory device at present. The hard disk has a long read/write access time and has a disadvantage associated with vibrations or the like because it has a mechanically driven part. In addition, parts constituting the hard disk have high cost. Replacement of a hard disk with an $E^2PROM$ is under examination.

An $E^2PROM$ is a device utilizing a tunnel current at a high electric field and injects a charge in a floating gate, thereby writing information. In this case, the charge accumulated in the floating gate can be sufficiently retained even upon a power-OFF operation. If an $E^2PROM$ is to be used as an auxiliary memory device, very strict requirements are imposed on the gate oxide film of a MOS structure portion. For example, stable write access in a high electric field of 12 to 13 MV/cm must be assured 10 million times, and data must be retained for 10 years.

However, in the conventional MOS structures, degradation of oxide films poses a serious problem, failing to satisfy the above requirements. Although various implementations in the manufacturing process have been proposed, satisfactory results have not yet been obtained. To the contrary, the MOS structure of the present invention can assure a long service life about 100 times that of the conventional MOS structure.

FIGS. 31A to 31C are sectional views for explaining the steps in manufacturing a floating gate type electrically programmable ROM (EPROM) according to the first embodiment of the second aspect of the present invention.

As shown in FIG. 31A, after an element isolation field oxide film 302 is formed in the surface of a p-type silicon wafer 301 having, e.g., a resistivity of 10 Ω·cm and a plane orientation (100), and metal contamination is removed from the surface by chemical cleaning. The silicon wafer 301 is then placed in an ultra-high vacuum of about $5\times10^{-11}$ Torr, and a spontaneous oxide film is removed at 900° C. by a silane reduction method. Two different source gases ($AlCl_3$ and $MgCl_2$) are supplied onto the silicon wafer using $H_2$ as a carrier gas and mixed with a $CO_2$ gas separately supplied using H as a carrier gas, thereby causing them to react with each other to epitaxially grow monocrystalline spinel ($MgAl_2O_4$) film 303, as indicated in a reference (Inoue, et. al., Denki Kagaku, Vol. 56, No. 7, p. 498 (1988)).

A phosphorus-doped amorphous silicon film is formed at a low temperature of 500° C., and crystal information is obtained from a monocrystalline insulating film obtained in 600° C. annealing, thereby forming a monocrystalline electrode 304, as shown in FIG. 31B. The surface of the monocrystalline silicon electrode 304 is then oxidized to form a silicon oxide film 305 serving as an interelectrode insulating film. As shown in FIG. 31C, a poly-Si electrode 306 serving as a control electrode is formed on the silicon oxide film 305. An EEPROM is finished through a predetermined wiring process (not shown).

The control electrode in the EEPROM shown in FIGS. 31A to 31C need not always be formed by a single crystal. However, stability of the interface between the control electrode and the underlying monocrystalline insulating film in the subsequent annealing can be increased by the use of a single crystal.

FIG. 32 is a sectional view of an EEPROM according to the second embodiment of the second aspect of the present invention. After a monocrystalline spinel ($MgAl_2O_4$) film 402 as in the first embodiment is formed on the surface of a p-type silicon wafer 401 having a plane orientation (100), the resultant structure is exposed in an oxygen atmosphere at a high temperature of, e.g., 800° C. to form a silicon oxide film 403 having a thickness of, e.g., 3 nm at an interface between the $MgAl_2O_4$ film 402 and the p-type silicon wafer 401. An EEPROM is formed following the same procedures as in the first embodiment.

In the second embodiment, the thickness of the silicon oxide film is set to about 3 nm. This aims at increasing the effective barrier height with respect to the charge of the insulating film. The effective barrier height increases as the thickness of the silicon oxide film 403 increases. In this case, when the thickness of the silicon oxide film 403 is excessively large, it is difficult to achieve the object of the present invention. The thickness of the silicon oxide film 403 is determined in accordance with the technical specifications such as an operating voltage and reliability, and preferably falls within a practical range of about 3 to 5 nm.

In this embodiment, after the monocrystalline insulating film 402 is formed, the silicon oxide film 403 is formed at the interface between the monocrystalline insulating film 402 and the silicon wafer 401 by the thermal oxidation method because the method of succeeding the crystal information of the monocrystalline insulating film 402 from the silicon wafer 401 is used. It is possible to use another method, e.g., the adhesion method as shown in the fifth embodiment, thereby forming the silicon oxide film 403 first.

FIG. 33 is a sectional view showing an EEPROM according to the third embodiment of the second aspect of the present invention. After a monocrystalline insulating film ($MgAl_2O_4$) 502 as in the first embodiment is formed on a p-type silicon wafer 501 having a plane orientation (100), the resultant structure is exposed in an oxygen atmosphere at a high temperature of, e.g., about 800° C. to form a silicon oxide film 503 at the interface between the $MgAl_2O_4$ film 502 and the p-type silicon wafer 501. A silicon oxide film 504 is formed on the surface of the monocrystalline insulating film 502 in accordance with the CVD method to form a three-layered tunnel insulating film. An EEPROM is formed following the same procedures as in the first embodiment.

Although the silicon oxide film 504 in this embodiment is formed by the CVD method, any method such as a sputtering method or a method using a reaction in a solution may be used if a thin silicon oxide film can be formed.

FIG. 34 is a sectional view of an EEPROM according to the fourth embodiment of the second aspect of the present invention. After a monocrystalline $SrTiO_3$ insulating film 602 is formed on the surface of a p-type silicon wafer 601 having a plane orientation (100) in accordance with a laser MBE method, a monocrystalline $CeO_2$ insulating film 603 is formed, as described in the reference (H. Nagata, et. al., Jap. J. Appl. Phys., Vol. 30, No. 6B, p. 1113687 (1991)). An EEPROM is formed following the same procedures as in the first embodiment.

FIGS. 35A to 35C are sectional views for explaining the steps in manufacturing an EEPROM according to the fifth embodiment of the second embodiment of the present invention. As shown in FIG. 35A, after a spontaneous oxide film is removed from the surface of a p-type silicon wafer 701 having, e.g., a resistivity of 10 Ω·cm and a plane orientation (100), using diluted hydrofluoric acid, the resultant structure is dipped in ultra-pure water having a dissolved oxygen concentration of ppb level or less, thereby terminating the dangling bonds on the surface of the silicon wafer 701 by hydrogen atoms. A thin quartz film 702 serving as a tunnel insulating film is joined to the surface of this silicon wafer 701, and the resultant structure is annealed in a nitrogen atmosphere at 1,000° C., thereby combining the atoms at the interface. The quartz is etched to a predetermined thickness, thereby obtaining a thin quartz film.

A poly-Si film 703 serving as a gate electrode is adhered to the surface of the thin quartz film 702. As shown in FIG. 35B, the poly-Si electrode 703, the thin quartz film 702, and the silicon wafer 701 are sequentially etched by a photoetching method to form a groove 704 in an element isolation region. To stabilize the surface of the groove 704, a silicon oxide film 705 having a thickness of about 10 nm is formed in the groove by the CVD method. After a silicon oxide film 706 as an element isolation insulating film is formed in the groove 704 by the CVD method, the resultant structure is etched back by RIE to remove the silicon oxide film 706 from the element formation region, so that the silicon oxide film 706 is buried in the groove 704.

As shown in FIG. 35C, the surface of the poly-Si film 703 is cleaned with a chemical to remove a spontaneous oxide film. A silicon oxide film 707 serving as an interelectrode insulating film is formed by thermal oxidation. A poly-Si film 708 serving as a control electrode is formed and patterned by a photoetching method. An EEPROM is formed through a wiring process.

In this embodiment, the silicon oxide film 706 is buried in the element isolation region. However, the material of the buried insulating film is not limited to a silicon oxide film, but may be an insulating film having excellent insulating properties, such as a silicon nitride film or an aluminum oxide film. The method of burying the element isolation insulating film is not limited to the CVD method, but can be any method capable of burying the insulating film. Changes and modifications may be made within the spirit and scope of the present invention.

Figure 36A:
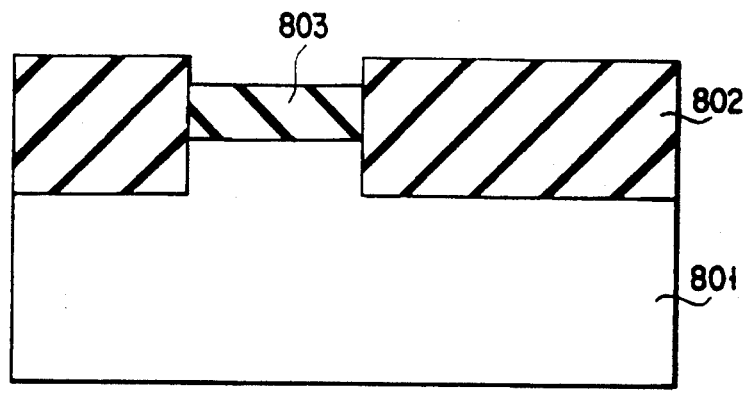
FIGS. 36A to 36C are sectional views showing an EEPRPM according to the sixth embodiment of the second aspect of the present invention.
Figure 36B:
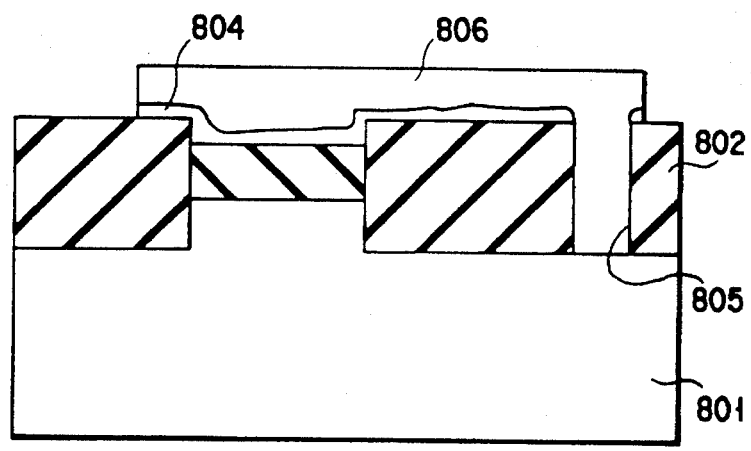
Figure 36C:
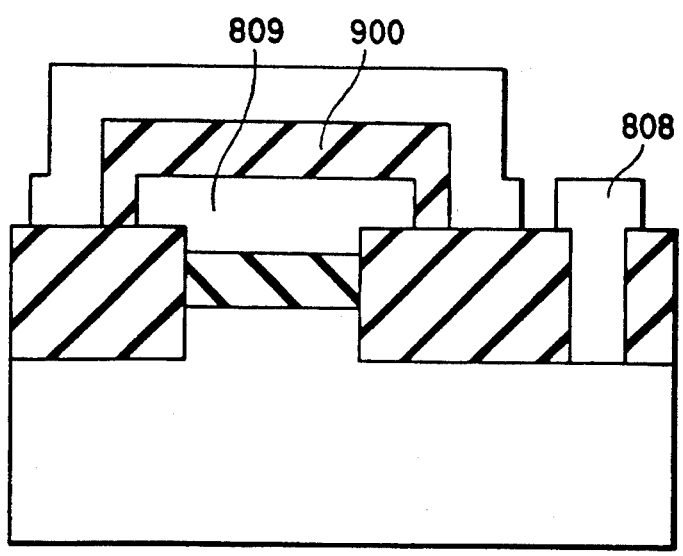

FIGS. 36A to 36C are sectional views for explaining the steps in manufacturing an EEPROM according to the sixth embodiment of the second aspect of the present invention. As shown in FIG. 36A, after an element isolation field oxide film 802 is formed in the surface of a p-type silicon wafer 801 having, e.g., a resistivity of 10 Ω·cm and a plane orientation (100), a silicon oxide film 803 is formed on the surface of the element formation region of the silicon wafer 801. As shown in FIG. 36B, an amorphous silicon film 804 is formed on the surface of the silicon oxide film 803, and an opening is formed in the amorphous silicon film 804 and the field oxide film 802 by a photoetching method so as to obtain crystal information from the silicon wafer 801.

The natural oxide film is removed by diluted hydrofluoric acid, and the dangling bonds on the surface of the silicon wafer 801 are terminated by ultra-pure water. A phosphorus-doped amorphous silicon film 806 is formed again to succeed the crystal information from the silicon wafer 801 through the opening 803 portion in annealing at a low temperature of about 600° C., thereby converting the amorphous silicon film 804 and the phosphorus-doped amorphous silicon film 803, both of which will serve as an electrode, into monocrystalline films. The monocrystalline silicon oxide film 807 is then etched by a photoetching method to disconnect an opening 808 from a floating gate electrode 809. The crystal information is succeeded from the floating gate electrode 809, and a monocrystalline $MgAl_2O_3$ insulating film 900 is formed following the same procedures as in the first embodiment.

An EEPROM is formed through the processes from the control gate electrode formation process following the same procedures as in the first embodiment. The resultant EEPROM of this embodiment is effective when the charge is exchanged between the floating gate electrode and the control gate electrode.

In this embodiment, the method of performing lateral solid-phase growth of an amorphous silicon film as a seed for monocrystallization of a silicon wafer is used as a method of forming a monocrystalline floating gate electrode. Solid-phase growth can have various modifications depending on the radiation energies of energy beams. A change in associated process such as an amorphous silicon formation process can be made in employing another monocrystallization method within the scope of the present invention.

Figure 37A:
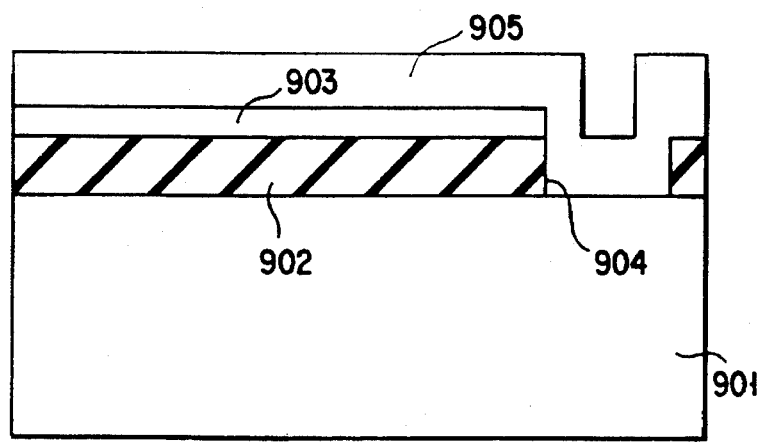
FIGS. 37A to 37C are sectional views showing an EEPRPM according to the seventh embodiment of the second aspect of the present invention.
Figure 37B:
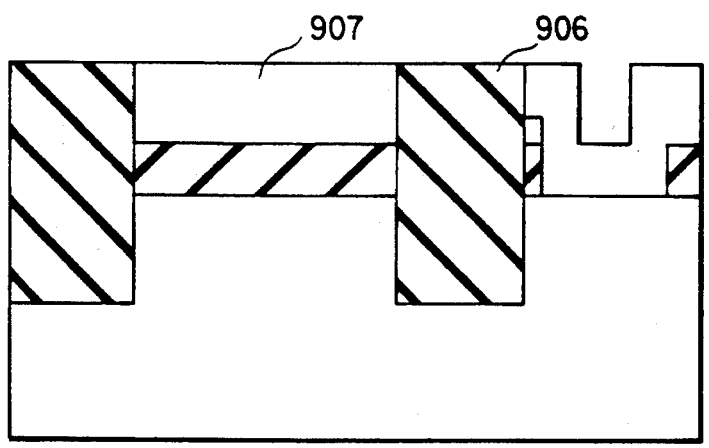
Figure 37C:
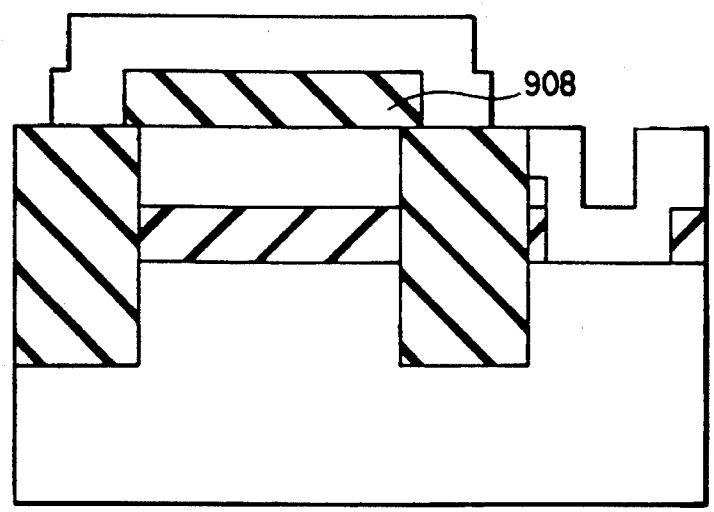

FIGS. 37A to 37C are sectional views for explaining the steps in manufacturing an EEPROM according to the seventh embodiment of the second aspect of the present invention. As shown in FIG. 37A, after a silicon oxide film 902 having a thickness of about 15 nm is formed on the surface of a p-type silicon wafer 901 having, e.g., a resistivity of 10 Ω·cm and a plane orientation (100) by a thermal oxidation method, an amorphous silicon film 903 is formed thereon. A region serving as a seed portion for monocrystallization (i.e., an amorphous silicon film 903 and the silicon oxide film 902 of scribed lines) is etched to form an opening 904 by a photoetching method.

A natural oxide film in the opening 904 is etched by diluted hydrofluoric acid in accordance with the method shown in the fifth embodiment. A phosphorus-doped amorphous silicon film 905 is then formed on the resultant structure again, and annealing is performed at about 600° C. to succeed the crystal information from the silicon wafer 901 through the opening 904. The amorphous silicon film 903 and the phosphorus-doped amorphous silicon film 905 are sequentially and laterally converted into single crystals. An element isolation insulating film 906 is buried following the same procedures as in the fifth embodiment. A monocrystalline insulating film, e.g., a monocrystalline $MgAl_2O_4$ insulating film 908 on the monocrystalline silicon film 907 is epitaxially grown as in the first embodiment, and a control gate electrode and the like are formed to finish an EEPROM.

The EEPROM of this embodiment is effective to exchange the charge between the floating gate electrode and the control gate electrode. In this embodiment, the seed for monocrystallization of the floating gate electrode is given by a scribed line. However, the present invention is not limited to this. Any region which does not influence element formation can be used. A region used as an element part such as a contact may be used. Except for an extreme economical disadvantage such as an increase in chip area, any distance can be used if it allows lateral propagation of crystal information from solid-phase growth.

In this embodiment, the method of burying the silicon oxide film 906 in the element isolation region is used. However, the material of the buried insulating film is not limited to the silicon oxide film, but can be any insulating film having excellent insulating properties, such as a silicon nitride film or an aluminum oxide film. The method of burying the element isolation insulating film is not limited to the CVD method. Various changes and modifications may be made within the spirit and scope of the invention if a method can bury an insulating film in the groove.

The above embodiment has exemplified an Si oxide film as a monocrystalline oxide film. However, the insulating film may consist of spinel (MgAl$_2$O$_4$), cerium oxide (CeO$_2$), strontium titanate (SrTiO$_3$), aluminum oxide (Al$_2$O$_3$), ), zirconium oxide (ZrO$_2$), yttrium oxide (Y$_2$O$_3$), yttrium-stabilized zirconium (YSZ), PrO$_2$, calcium fluoride (CaF$_2$), or a multilayered film thereof.

A silicon oxide film may be interposed at an interface between a monocrystalline insulating film and an underlying silicon wafer or underlying electrode.

The present invention may be applied to a quantum effect device or a silicon-on-insulator device.

As has been described above, according to the present invention, mismatching at an interface between a gate insulating film and a substrate is set to be minimum. In addition, the present invention provides an allowable quality range of a gate insulating film. The reduction in mismatching at the interface cause suppression of level formation which interferes with a conduction phenomenon and causes improvement of reliability. The present invention predicts a structure by a molecular dynamic simulator. According to the present invention, a highly reliable semiconductor device which can prevent dielectric breakdown and degradation of the insulating film by the electric field can be obtained.

Further, it is considered possible that the simulation method using the molecular movement dynamic simulator of the present invention is applied to insulating films other than those of the MOS semiconductor device. The simulation method is also effective for the designing of a high dielectric thin film of, for example, STO (compound consisting of strontium, titanium and oxygen). Specifically, the STO thin film is made of a perovskite-based material, and therefore is not easily fit with an Si crystal as it is. However, by using the present simulation method, it is easy to find which plane fits which plane.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor device comprising a monocrystalline silicon substrate, an insulating film consisting essentially of a monocrystalline silicon oxide formed on a surface of said monocrystalline silicon substrate, and a conductive film formed on said insulating film, wherein crystal orientations of said monocrystalline silicon substrate and said insulating film are set such that a difference between an Si—Si distance of Si atoms in said monocrystalline silicon substrate and an Si—Si difference of Si atoms in said insulating film present at positions corresponding to the Si atoms in the substrate falls within a range of ±7%.

2. A device according to claim 1, wherein the crystal orientations of said monocrystalline silicon substrate and said insulating film are set such that the difference between the Si—Si distance of the Si atoms in said monocrystalline silicon substrate and the Si—Si difference of the Si atoms in said insulating film present at the positions corresponding to the Si atoms in the substrate falls within a range of ±4%.

3. A device according to claim 1, wherein said insulating film comprises a gate insulating film constituting a MOSFET.

4. A device according to claim 1, wherein said semiconductor device is a capacitor.

5. A semiconductor device comprising a monocrystalline silicon substrate, an insulating film consisting essentially of a monocrystalline silicon oxide formed on a surface of said monocrystalline silicon substrate, and a conductive film formed on said insulating film, wherein an oxygen defect concentration of said insulating film is not more than 0.01%.

6. A device according to claim 5, wherein the oxygen defect concentration of said insulating film is not more than 0.005%.

7. A device according to claim 5, wherein said insulating film comprises a gate insulating film constituting a MOSFET.

8. A device according to claim 5, wherein said semiconductor device is a capacitor.

9. A semiconductor device comprising a monocrystalline silicon substrate, an insulating film consisting essentially of a monocrystalline silicon oxide formed on a surface of said monocrystalline silicon substrate, and a conductive film formed on said insulating film, wherein said monocrystalline silicon oxide consists essentially of a cristobalite.

10. A device according to claim 9, wherein said insulating film comprises a gate insulating film constituting a MOSFET.

11. A device according to claim 9, wherein said semiconductor device is a capacitor.

12. A semiconductor device comprising a monocrystalline silicon substrate, an insulating film consisting essentially of a monocrystalline silicon oxide formed on a surface of said monocrystalline silicon substrate, and a conductive film formed on said insulating film, wherein said monocrystalline silicon substrate has a plane orientation (110), and said insulating film essentially consists of monocrystalline quartz having a plane orientation falling within a range of +6° from a (1,−1,0,1) plane.

13. A device according to claim 12, wherein said monocrystalline silicon substrate has a plane orientation (110), and said insulating film essentially consists of monocrystalline quartz having a plane orientation falling within a range of ±4° from a (1,−1,0,1) plane.

14. A device according to claim 12, wherein said insulating film comprises a gate insulating film constituting a MOSFET.

15. A device according to claim 12, wherein said semiconductor device is a capacitor.

16. A semiconductor device comprising a monocrystalline silicon substrate, an insulating film consisting essentially of a monocrystalline silicon oxide formed on a surface of said monocrystalline silicon substrate, and a conductive film formed on said insulating film., wherein said monocrystalline silicon substrate has a plane orientation (100), and said insulating film consists essentially of monocrystalline quartz having a plane orientation falling within a range of ±6° from a (1,−1,0,1) plane.

17. A device according to claim 16, wherein said monocrystalline silicon substrate has a plane orientation (100), and said insulating film essentially consists of monocrystalline quartz having a plane orientation falling within a range of ±4° from a (1,−1,0,1) or (1,0,−1,0) plane.

18. A device according to claim 16, wherein said insulating film comprises a gate insulating film constituting a MOSFET.

19. A device according to claim 16, wherein said semiconductor device is a capacitor.

20. A semiconductor device comprising a monocrystalline silicon substrate, an insulating film consisting of a monocrystalline silicon oxide formed on a surface of said monocrystalline silicon substrate, and a conductive film formed on said insulating film, wherein said monocrystalline silicon substrate has a (100) plane orientation, said insulating film essentially consists of β-cristobalite having a unit structure in a $P4_12_12$ structural expression in such a manner that every other silicon atom of four silicon atoms aligned about a C-axis are arranged on two adjacent silicon atoms aligned in a [110] direction on an Si (100) plane, and that a plane including the C-axis of said β-cristobalite and the [110] direction is perpendicular to the (100) plane.

21. A device according to claim 20, wherein crystal orientations of said monocrystalline silicon substrate and said insulating film are set such that a difference between an Si—Si distance of Si atoms in said monocrystalline silicon substrate and an Si—Si difference of Si atoms in said insulating film present at positions corresponding to the Si atoms in the substrate falls within a range of ±7%.

22. A device according to claim 21, wherein the crystal orientations of said monocrystalline silicon substrate and said insulating film are set such that the difference between the Si—Si distance of the Si atoms in said monocrystalline silicon substrate and the Si—Si difference of the Si atoms in said insulating film present at the positions corresponding to the Si atoms in the substrate falls within a range of ±4%.

23. A device according to claim 20, wherein an oxygen defect concentration of said insulating film is not more than 0.01%.

24. A device according to claim 23, wherein the oxygen defect concentration of said insulating film is not more than 0.005%.

25. A device according to claim 20, wherein said insulating film comprises a gate insulating film constituting a MOSFET.

26. A device according to claim 20, wherein said semiconductor device is a capacitor.

27. A semiconductor device comprising a monocrystalline silicon substrate, an insulating film consisting essentially of a monocrystalline silicon oxide formed on a surface of said monocrystalline silicon substrate, and a conductive film formed on said insulating film, wherein said monocrystalline silicon substrate has a plane orientation (100), and said insulating film consists essentially of monocrystalline quartz having a plane orientation falling within a range of ±6° from a (1,0,−1,0) plane.

28. A device according to claim 27, wherein said monocrystalline silicon substrate has a plane orientation (100), and said insulating film consists essentially of monocrystalline quartz having a plane orientation falling within a range of ±4° from a (1,0,−1,0) plane.

29. A device according to claim 28, wherein said semiconductor device is a capacitor.

30. A device according to claim 28, wherein said insulating film comprises a gate insulating film constituting a MOSFET.

31. A device according to claim 27, wherein said insulating film comprises a gate insulating film constituting a MOSFET.

32. A device according to claim 27, wherein said semiconductor device is a capacitor.

* * * * *